(12) United States Patent
Takiguchi et al.

(10) Patent No.: US 9,716,002 B2
(45) Date of Patent: Jul. 25, 2017

(54) SUBSTRATE CLEANING METHOD

(71) Applicant: TOKYO ELECTRON LIMITED, Tokyo (JP)

(72) Inventors: Yasushi Takiguchi, Koshi (JP); Taro Yamamoto, Koshi (JP); Akihiro Fujimoto, Koshi (JP); Shuuichi Nishikido, Koshi (JP); Dai Kumagai, Koshi (JP); Naoto Yoshitaka, Koshi (JP); Takahiro Kitano, Koshi (JP); Yoichi Tokunaga, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/204,068

(22) Filed: Jul. 7, 2016

(65) Prior Publication Data

US 2016/0314958 A1 Oct. 27, 2016

Related U.S. Application Data

(62) Division of application No. 14/049,815, filed on Oct. 9, 2013, now abandoned, which is a division of
(Continued)

(30) Foreign Application Priority Data

Dec. 20, 2006 (JP) .................................. 2006-343309
Nov. 22, 2007 (JP) .................................. 2007-303453

(51) Int. Cl.
*H01L 21/02* (2006.01)
*B08B 3/02* (2006.01)
(Continued)

(52) U.S. Cl.
CPC .......... *H01L 21/0209* (2013.01); *B08B 1/002* (2013.01); *B08B 1/04* (2013.01);
(Continued)

(58) Field of Classification Search
None
See application file for complete search history.

(56) References Cited

U.S. PATENT DOCUMENTS 5,361,449 A    11/1994   Akimoto
5,465,447 A *  11/1995   Itoh ........................... B08B 1/04
                                                              134/6
(Continued)

FOREIGN PATENT DOCUMENTS

JP    H06-289625 A     10/1994
JP    7-169732          7/1995
(Continued)

*Primary Examiner* — Katelyn Whatley
(74) *Attorney, Agent, or Firm* — Smith, Gambrell & Russell, LLP

(57) ABSTRACT

A disclosed substrate cleaning apparatus for cleaning a back surface of a substrate includes a first substrate supporting portion configured to support the substrate at a first area of a back surface of the substrate, the back surface facing down; a second substrate supporting portion configured to support the substrate at a second area of the back surface of the substrate, the second area being separated from the first area; a cleaning liquid supplying portion configured to supply cleaning liquid to the back surface of the substrate; a drying portion configured to dry the second area of the back surface of the substrate; and a cleaning portion configured to clean a third area of the back surface of the substrate when the substrate is supported by the first substrate supporting portion, the third area including the second area, and a fourth area of the back surface of the substrate when the substrate is supported by the second substrate supporting portion, the fourth area excluding the second area of the back surface.

15 Claims, 24 Drawing Sheets

Related U.S. Application Data application No. 12/000,670, filed on Dec. 14, 2007, now Pat. No. 8,578,953.

(51) Int. Cl.

| | | |
|---|---|---|
| *H01L 21/67* | (2006.01) | |
| *B08B 1/00* | (2006.01) | |
| *B08B 1/04* | (2006.01) | |
| *B08B 5/02* | (2006.01) | |
| *B08B 7/00* | (2006.01) | |
| *H01L 21/687* | (2006.01) | |

(52) U.S. Cl.
CPC .................. *B08B 3/02* (2013.01); *B08B 5/02* (2013.01); *B08B 7/0057* (2013.01); *H01L 21/67028* (2013.01); *H01L 21/67046* (2013.01); *H01L 21/67051* (2013.01); *H01L 21/68742* (2013.01); *H01L 21/68764* (2013.01)

(56) References Cited

U.S. PATENT DOCUMENTS

| | | | |
|---|---|---|---|
| 5,518,542 A | 5/1996 | Matsukawa et al. | |
| 5,803,970 A | 9/1998 | Tateyama et al. | |
| 5,871,584 A | 2/1999 | Tateyama et al. | |
| 5,945,161 A * | 8/1999 | Hashimoto | ............. B05C 11/08 118/52 |
| 6,054,015 A | 4/2000 | Brunelli et al. | |
| 6,058,544 A | 5/2000 | Motoda et al. | |
| 6,115,867 A | 9/2000 | Nakashima et al. | |
| 6,193,807 B1 | 2/2001 | Tateyama et al. | |
| 6,261,378 B1 | 7/2001 | Hashimoto et al. | |
| 6,276,378 B1 | 8/2001 | Taniyama et al. | |
| 6,295,683 B1 | 10/2001 | Lai et al. | |
| 6,536,454 B2 | 3/2003 | Lindner | |
| 6,688,155 B2 | 2/2004 | Ko et al. | |
| 2001/0010103 A1 | 8/2001 | Konishi et al. | |
| 2004/0197433 A1* | 10/2004 | Terada | .................. B08B 7/0042 425/174.4 |
| 2004/0250839 A1* | 12/2004 | Robertson | .................. B08B 3/02 134/33 |
| 2005/0016818 A1 | 1/2005 | Ito et al. | |
| 2005/0243293 A1 | 11/2005 | Hara et al. | |
| 2006/0090848 A1 | 5/2006 | Koga et al. | |
| 2007/0289528 A1 | 12/2007 | Nanba et al. | |

FOREIGN PATENT DOCUMENTS

| | | |
|---|---|---|
| JP | 7-335599 | 12/1995 |
| JP | H0889910 A * | 4/1996 |
| JP | 11162816 A | 6/1999 |
| JP | 3377414 | 12/2002 |

\* cited by examiner

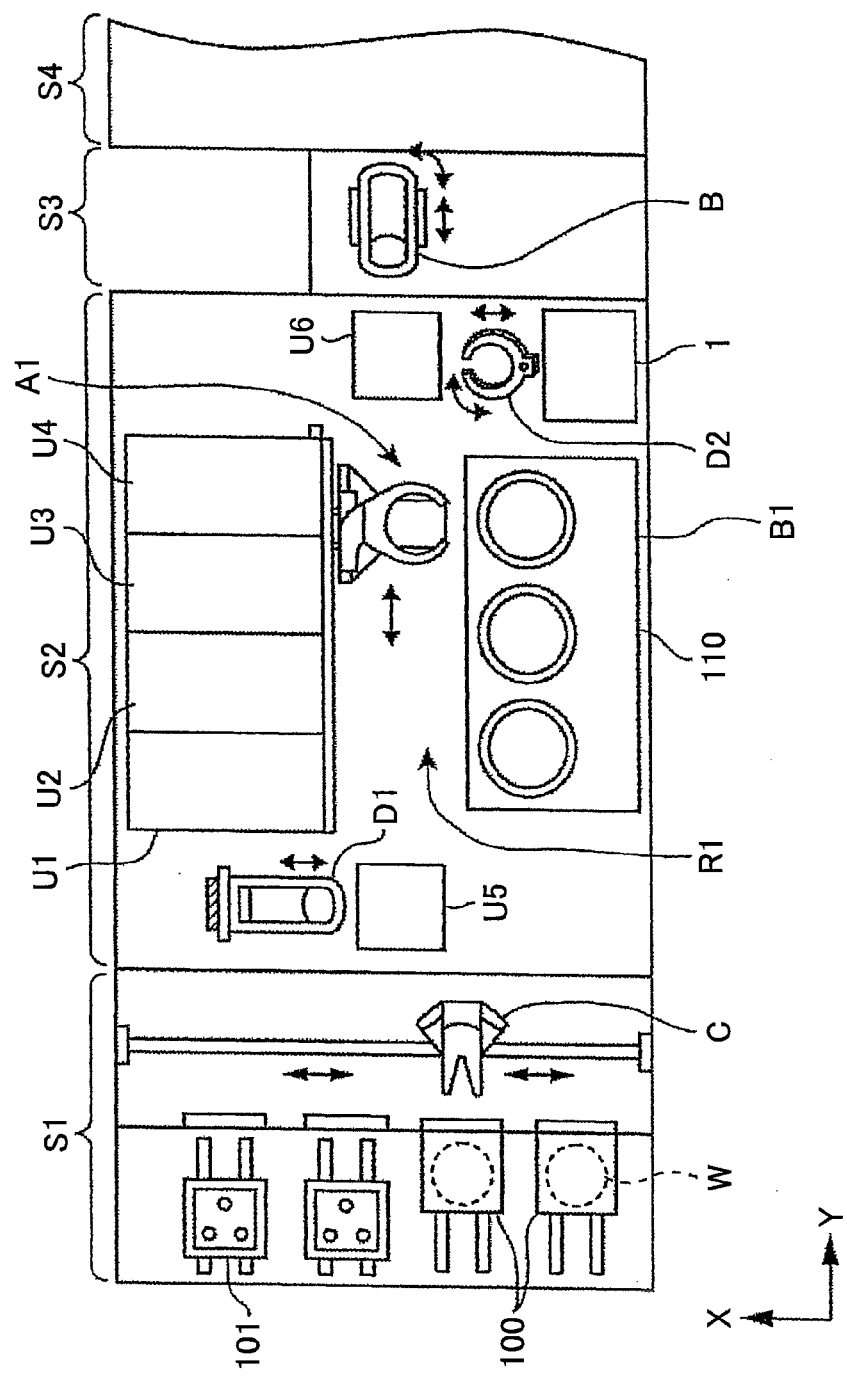

SUBSTRATE CLEANING METHOD

BACKGROUND OF THE INVENTION

1. Field of the Invention

The present invention relates to a technology for cleaning a back surface of a substrate such as a semiconductor wafer and a glass substrate (Liquid Crystal Display (LCD) substrate) for LCD.

2. Description of the Related Art

In a fabrication process of a semiconductor device, it is very important to keep, for example, a semiconductor wafer (referred to as just a wafer hereinafter) clean. Therefore, various cleaning processes for cleaning a top surface of the wafer are carried out, when necessary, before or after various processes.

Generally, the top surface of the wafer can be cleaned by placing a brush on the top surface of the wafer that is firmly fixed on, for example, a vacuum chuck or a mechanical chuck, and moving the brush with respect to the wafer while supplying deionized water or the like to the top surface. With this, particles on the top surface are removed.

Such cleaning has come to be necessary for a back surface of the wafer in addition to the top surface on which a circuit is formed. For example, when particles stay on the back surface of the wafer and the wafer is placed on a wafer stage in a stepper, the particles between the back surface and the wafer stage may bend the wafer, leading to a so-called defocusing problem in the photolithography process. Since further reduction in line width is being pursued in the fabrication processing of semiconductor devices, which brings forth new process technologies, such as immersion lithography, double patterning, or the like, defocusing is thought to be a more serious problem. Moreover, since not only the new processes but also new materials to replace conventional materials are emerging along with the line width reduction, the number of processes tends to be increasing, which may create more particles on the back surface of the wafer. Therefore, cleaning the back surface of the wafer has drawn more attention than ever.

By the way, the photolithography process is carried out in a photolithography system composed of a photoresist coater/developer in which a photoresist is spun on the top surface of the wafer and the photoresist is developed, and a subsequent exposure apparatus in which the developed photoresist is exposed so as to produce a predetermined pattern in the photoresist. Since the wafer transferred inside the system is usually kept face-up, the wafer needs to be reversed up-side-down by a so-called wafer reverser in order to clean the back surface of the wafer when a cleaning tool employing the brush to be pressed on the wafer from above is used. If such a wafer reverser is placed in the photolithography system, the system has to have a space for the reverser itself and a space for reversing the wafer, which inevitably increases the size of the photolithography system. In addition, even if the brush for cleaning the back surface of the wafer is disposed below the wafer in order to eliminate the need for the wafer reverser, the brush cannot entirely clean the back surface since the wafer is usually supported from below by the wafer chuck or the like, which disturbs the cleaning.

In order to address such problems, the Patent Document 1 below has proposed a substrate cleaning apparatus including a newly designed spin chuck for rotatably holing the wafer. This spin chuck is shaped into a hollow cylinder having substantially the same diameter as the diameter of the wafer. The spin chuck has inside the cylinder the brush and a nozzle for ejecting cleaning liquid toward the back surface of the wafer. With this configuration, the wafer is transferred face-up to the hollow cylinder, and held at the wafer edge by a mechanical chuck or the like that is located at the top end portion of the cylinder. Next, the brush inside the cylinder is raised so as to contact the back surface of the wafer, and the cleaning liquid is discharged from the nozzle. Then, the wafer is rotated by the spin chuck and the brush is shifted with respect to the wafer, which enables cleaning the entire area of the back surface of the wafer without using the reverser.

Patent Document 1: Japanese Patent Publication No. 3377414 (paragraphs 0036 through 0040, FIG. 3)

However, since the wafer is held at its edge by the mechanical chuck or the like on the top end portion of the hollow cylinder in the substrate cleaning apparatus disclosed in Patent Document 1, the possibility of wafer edge damage cannot be completely denied. In addition, the following problem may be caused. When immersion lithography is carried out, the edge of the resist layer forming on the wafer extends generally to bevel and vertical portions (or round portion) of the wafer edge in order to avoid the edge of the resist layer being wetted with the deionized wafer used in the immersion lithography. This is because the resist layer may be exfoliated if the edge of the resist layer becomes wetted with the water. In this situation, if the wafer is held at its edge by the mechanical chuck, the resist layer may be damaged, thereby generating particles and causing possible exfoliation of the resist layer.

The present invention has been made in view of the above, and is directed to a substrate cleaning apparatus and a method of cleaning a substrate which enable cleaning the back surface of the wafer without reversing the substrate and can avoid the circumferential portion of the wafer being damaged.

SUMMARY OF THE INVENTION

In order to achieve the above objective, a first aspect of the present invention provides a substrate cleaning apparatus for cleaning a back surface of a substrate. The apparatus includes a first substrate supporting portion configured to support the substrate at a first area of a back surface of the substrate, the back surface facing down; a second substrate supporting portion configured to support the substrate at a second area of the back surface of the substrate, the second area being separated from the first area; a cleaning liquid supplying portion configured to supply cleaning liquid to the back surface of the substrate; a drying portion configured to dry the second area of the back surface of the substrate; and a cleaning portion configured to clean a third area of the back surface of the substrate when the substrate is supported by the first substrate supporting portion, the third area including the second area, and a fourth area of the back surface of the substrate when the substrate is supported by the second substrate supporting portion, the fourth area excluding the second area of the back surface.

A second aspect of the present invention provides the substrate cleaning apparatus according to the first aspect, wherein the second substrate supporting portion is configured to rotate the substrate around a substantial center of the substrate and spin off the cleaning liquid remaining on the back surface of the substrate that has undergone the cleaning by the cleaning portion so as to dry the substrate.

A third aspect of the present invention provides the substrate cleaning apparatus according to the first or the second aspects, wherein the drying portion is configured to blow gas toward the back surface of the substrate.

A fourth aspect of the present invention provides the substrate cleaning apparatus according to any one of the first through the third aspects. The substrate cleaning apparatus of the fourth aspect further includes a moving portion that laterally moves the first substrate supporting portion with respect to the second substrate supporting portion.

A fifth aspect of the present invention provides the substrate cleaning apparatus according to the fourth aspect, wherein the first substrate supporting portion includes a wafer holding pad having a rectangular surface to meet the first area of the back surface of the substrate, in which a longitudinal direction of the wafer holding pad coincides with a moving direction of the first substrate supporting portion.

A sixth aspect of the present invention provides the substrate cleaning apparatus according to the fourth aspect, wherein the first substrate supporting portion includes a wafer holding pad having an arc-shaped surface to contact the first area of the back surface of the substrate, the arc-shaped surface being curved along a concentric circle of the substrate supported by the first substrate supporting portion.

A seventh aspect of the present invention provides the substrate cleaning apparatus according to any one of the fourth through the sixth aspects. This substrate cleaning apparatus further includes a cup configured to surround the substrate supported by either one of the first substrate supporting portion and the second substrate supporting portion and move along with the first substrate supporting portion.

An eighth aspect of the present invention provides the substrate cleaning apparatus according to the seventh aspect, wherein an inner wall of the cup is formed of a material adapted to moderate splashing of the cleaning liquid that collides with the inner wall.

A ninth aspect of the present invention provides the substrate cleaning apparatus according to the eighth aspect, wherein the splash-moderating material is a hydrophilic and porous material.

A tenth aspect of the present invention provides the substrate cleaning apparatus according to the eighth aspect, wherein the splash-moderating material is a surface-roughened ceramic.

An eleventh aspect of the present invention provides the substrate cleaning apparatus according to any one of the fourth through the tenth aspects, wherein the drying portion includes an enclosing member that encloses the second substrate supporting portion and has at an upper end of the enclosing member an orifice through which gas is blown.

A twelfth aspect of the present invention provides the substrate cleaning apparatus according to the eleventh aspect, further including an exhaust apparatus that exhausts an inside of the enclosing member.

A thirteenth aspect of the present invention provides the substrate cleaning apparatus according to the eleventh or the twelfth aspect. The substrate cleaning apparatus of the thirteenth aspect further includes a fluid ejecting portion that ejects a fluid so that the fluid passes between a first position of the back surface of the substrate, the first position opposing the cleaning liquid supplying portion, and a second position of the back surface of the substrate, the second position opposing the enclosing member.

A fourteenth aspect of the present invention provides the substrate cleaning apparatus according to the thirteenth aspect, wherein the fluid ejected from the fluid ejecting portion is the cleaning liquid.

A fifteenth aspect of the present invention provides the substrate cleaning apparatus according to any one of the first through third aspects. The substrate cleaning apparatus of the fifteenth aspect further includes a first elevating portion configured to move the second substrate supporting portion up and down with respect to the first substrate supporting portion; and a cover member configured to cover the second substrate supporting portion. Here, the second substrate supporting portion is lowered by the first elevating portion below the second area of the substrate supported by the first substrate supporting portion and the cover member is positioned over the second substrate supporting portion, while the second area is cleaned by the cleaning portion.

A sixteenth aspect of the present invention provides the substrate cleaning apparatus according to any one of the first through the fifteenth aspects, further including a first ultraviolet light source configured to emit ultraviolet light to the back surface of the substrate when the substrate is transferred in or out from the substrate cleaning apparatus.

A seventeenth aspect of the present invention provides the substrate cleaning apparatus according to any one of the first through the sixteenth aspects. The substrate cleaning apparatus of this aspect further includes a measuring instrument configured to measure a contact force with which the cleaning portion contacts the back surface of the substrate; a second elevating portion configured to adjust a positional relationship between the cleaning portion and the substrate; and a control portion configured to control the second elevating portion so that the contact force falls within a predetermined range, in accordance with the measurement result by the measuring instrument.

An eighteenth aspect of the present invention provides the substrate cleaning apparatus according to any one of the first through the seventeenth aspects, wherein there exists a gap between the cleaning member and the back surface of the substrate.

A nineteenth aspect of the present invention provides the substrate cleaning apparatus according to any one of the first through the seventeenth aspects, further comprising a second ultraviolet light source configured to emit ultraviolet light onto the back surface of the substrate when the wafer is supported by the second substrate supporting portion.

A twentieth aspect of the present invention provides the substrate cleaning apparatus according to any one of the first through the nineteenth aspects, further including a suction tube connected to the first substrate supporting portion and configured to take suction on the back surface of the wafer so as to hold the substrate onto the first substrate supporting portion; and a trap tank provided in a middle of the suction tube and configured to trap the cleaning liquid that flows through the suction tube.

A twenty-first aspect of the present invention provides the substrate cleaning apparatus according to any one of the first through the twentieth aspects, further comprising a gas nozzle configured to blow gas toward the first substrate supporting portion.

A twenty-second aspect of the present invention provides a substrate cleaning method including steps of supporting a substrate at a first area of a back surface of the substrate, the back surface facing down; cleaning a second area of the back surface of the substrate, the second area excluding the first area; drying at least a third area of the back surface of the substrate, the third area being in the second area; supporting the substrate at the third area of the back surface, instead of the first area; and cleaning a fourth area of the back surface of the substrate, the fourth area excluding the third area.

A twenty-third aspect of the present invention provides a substrate cleaning method according to the twenty-second aspect, further including a step of spinning the substrate so as to dry the fourth area of the back surface of the substrate.

A twenty-fourth aspect of the present invention provides a substrate cleaning method according to the twenty-second or the twenty-third aspect, wherein the drying of at least the third area is performed by blowing air onto the third area.

A twenty-fifth aspect of the present invention provides a substrate cleaning method according to any one of the twenty-second through the twenty-fourth aspects, further comprising a step of illuminating the back surface of the substrate with ultraviolet light.

A twenty-sixth aspect of the present invention provides a computer-readable storage medium which stores a program used in a substrate cleaning apparatus configured to clean a back surface of the substrate, the program comprising procedures for causing the substrate cleaning apparatus to perform steps of supporting a substrate at a first area of a back surface of the substrate, the back surface facing down; cleaning a second area of the back surface of the substrate, the second area excluding the first area; drying at least a third area of the back surface of the substrate, the third area being in the second area; supporting the substrate at the third area of the back surface, instead of the first area; and cleaning a fourth area of the back surface of the substrate, the fourth area excluding the third area.

According to the substrate cleaning apparatus of the various aspects of the present invention, since the wafer is supported from its back surface and the back surface is cleaned, there is no need for a reverser that reverses the wafer for the purpose of cleaning the back surface of the substrate. With this, a space required to implement the reverser and a space required to reverse the substrate are not necessary. As a result, when the substrate cleaning apparatus according to the aspects of the present invention is integrated into the coater/developer or the photolithography system, the coater/developer or the photolithography system can be made compact compared to the conventional coater/developer or photolithography system.

In addition, according to the substrate cleaning apparatus of the various aspects of the present invention, since the substrate is transferred between the two types of the substrate supporting portions that support the substrate at different areas, there are no unclean regions in the back surface. Therefore, the need for the mechanism that mechanically holds the edge of the substrate can be eliminated. This is advantageous in that the edge of the substrate cannot be damaged, so that particles on and damage to the photoresist film can be prevented from being caused, thereby improving production yield.

BRIEF DESCRIPTION OF THE DRAWINGS

Other objects, features and advantages of the present invention will become more apparent from the following detailed description when read in conjunction with the accompanying drawings, in which:

FIG. 11 is a plan view of a coater/developer to which the substrate cleaning apparatus according to the embodiments of the present invention is applied;

DETAILED DESCRIPTION OF THE PREFERRED EMBODIMENT

Figure 1:
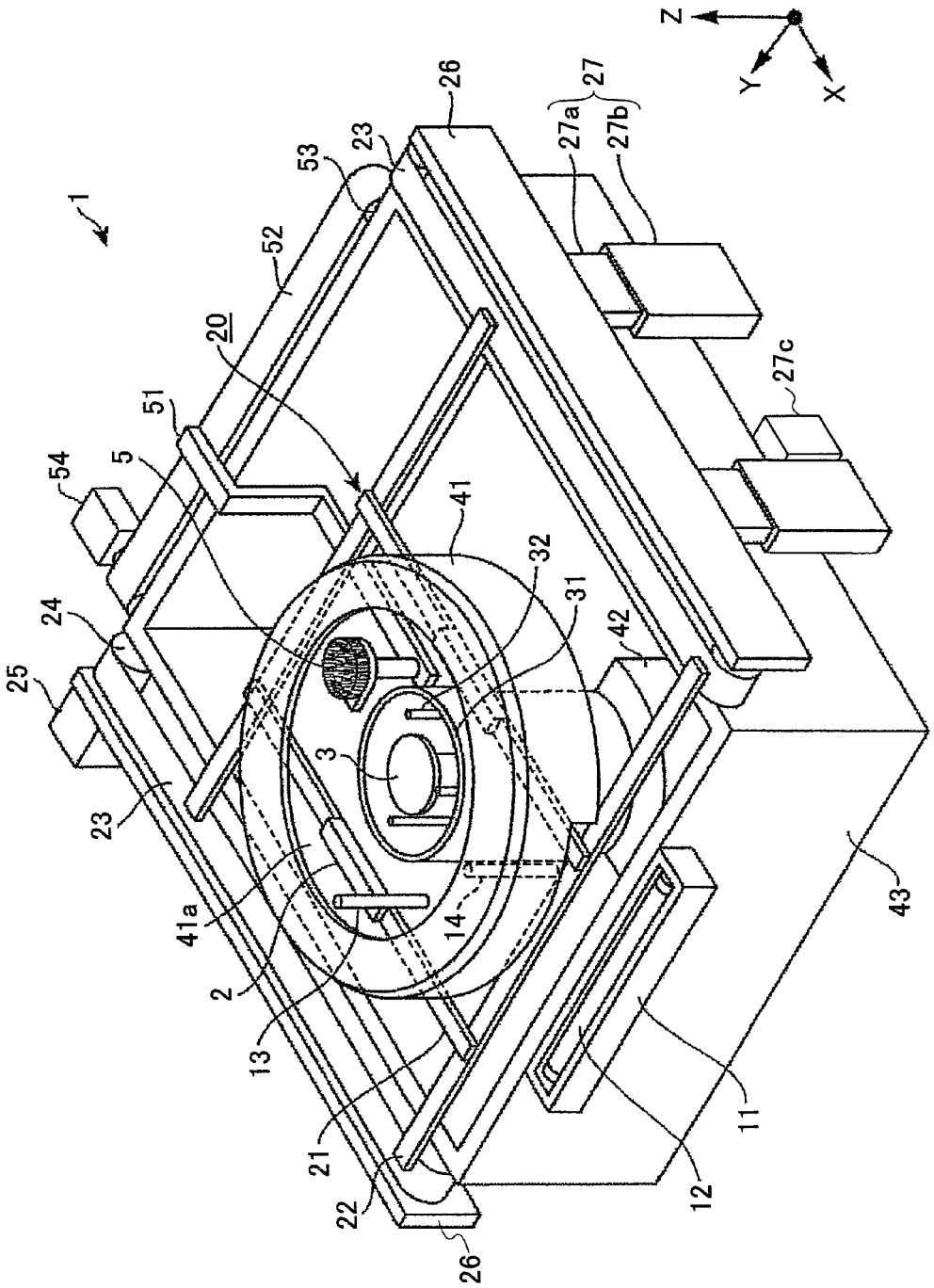
FIG. 1 is a perspective view of a cleaning apparatus according to a first embodiment of the present invention.

Referring to the accompanying drawings, a substrate cleaning apparatus according to exemplary embodiments of the present invention will be described. In the drawings, the same or corresponding reference marks are given to the same or corresponding members or components. It is to be noted that the drawings are illustrative of the invention, and there is no intention to indicate scale or relative proportions among the members or components. Therefore, the specific size should be determined by a person having ordinary skill in the art in view of the following non-limiting embodiments.

In addition, the cleaning apparatus to be arranged beside and used with the coater/developer is described in the following non-limiting embodiments. Specifically, the cleaning apparatus is disposed in the vicinity of a wafer exit slot of the coater/developer. The cleaning apparatus cleans a wafer backside of the wafer that has a resist layer on the top surface and has been transferred from the coater/developer and then sends the cleaned wafer to an exposure apparatus. All the photolithography processes including the cleaning process by the cleaning apparatus focused on are described later.

First Embodiment

Figure 2:
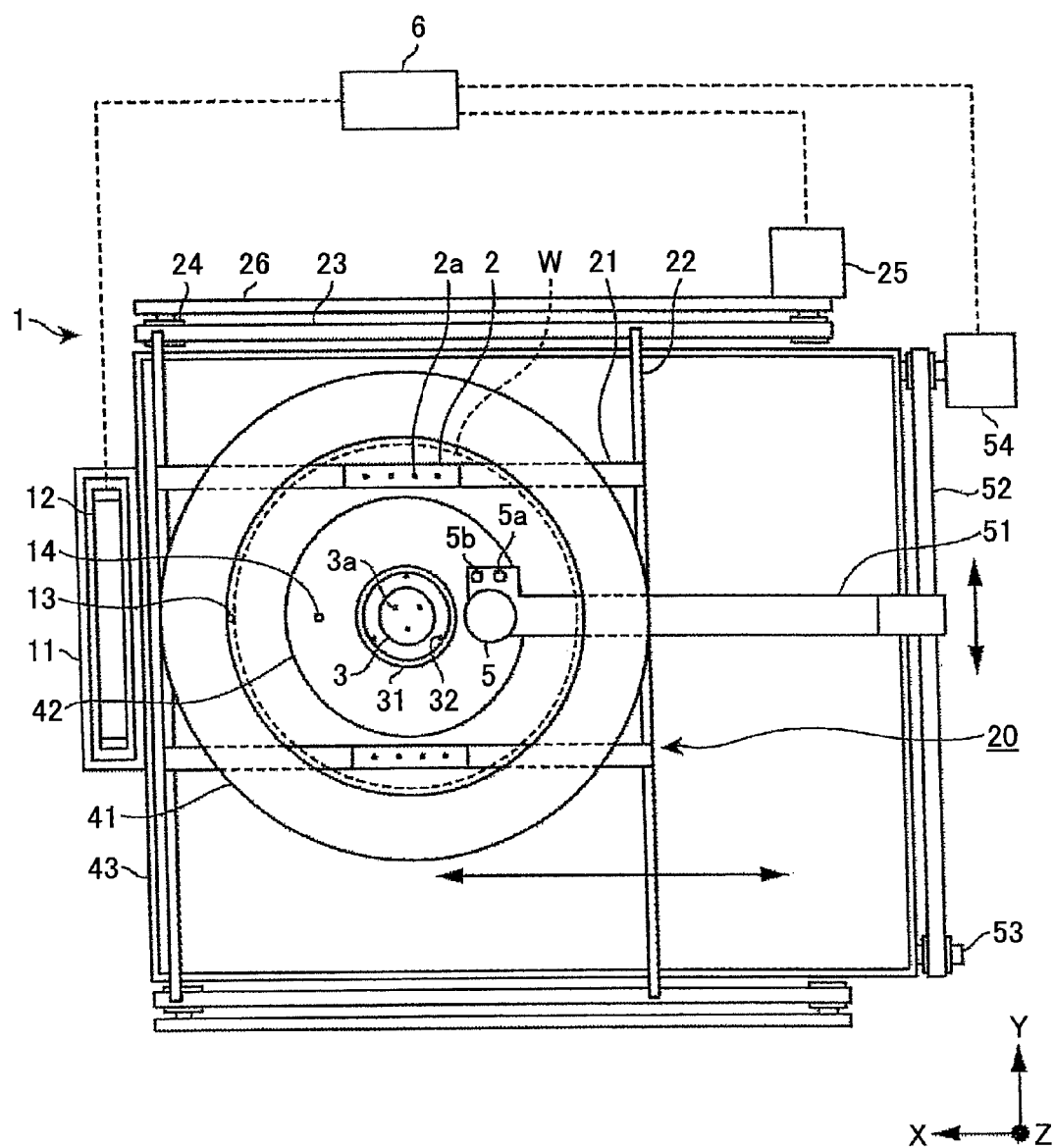
FIG. 2 is a plan view of the cleaning apparatus shown in FIG. 1.
Figure 3:
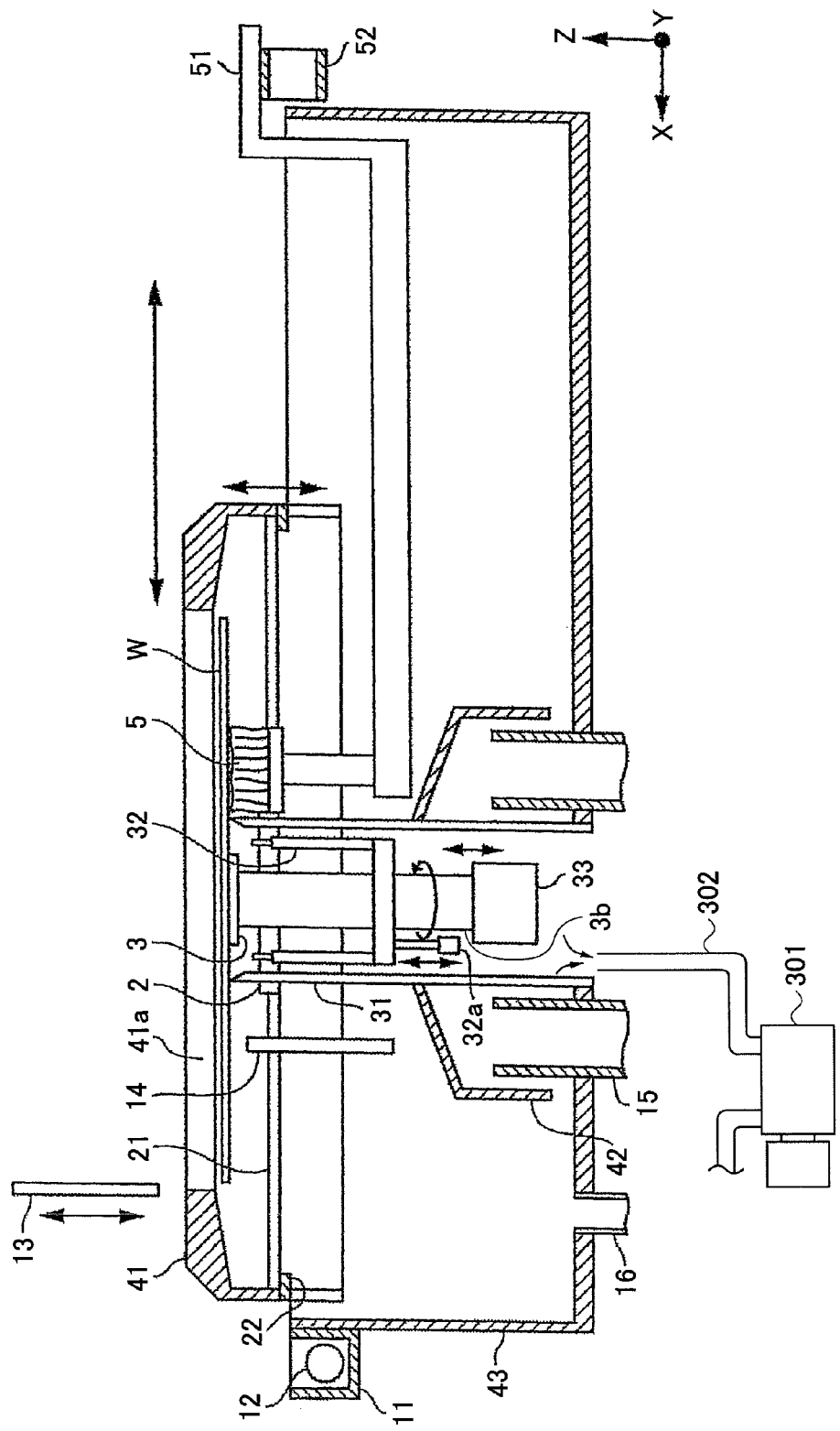
FIG. 3 is a cut-away side view of the cleaning apparatus shown in FIG. 1.

First, a structure of the cleaning apparatus according to this embodiment of the present invention is explained in reference to FIGS. 1 through 3. FIG. 1 is a perspective view of a cleaning apparatus 1; FIG. 2 is a plan view of the cleaning apparatus 1; and FIG. 3 is a cut-away side view of the cleaning apparatus 1.

As shown in FIG. 1, the cleaning apparatus 1 includes wafer holding pads 2 serving as a first substrate supporting portion that receives a wafer from a transporting portion (for example, a horizontal transport arm D2 in FIG. 5A) provided in the coater/developer and supports the wafer, a spin chuck 3 that serves as a second substrate supporting portion for receiving the wafer from the wafer holding pads 2 so as to horizontally hold the wafer, and a brush 5 that serves as a cleaning portion for contacting a back surface of the wafer so as to clean the back surface. These elements are located inside an open box-shaped under cup 43.

By the way, the wafer W is typically a semiconductor wafer for fabricating semiconductor devices but may be a glass substrate, for example, for fabricating liquid crystal panels. In addition, the wafer W is not limited to these, but may be any plate member made of other materials in other embodiments.

First, the wafer holding pads 2 as the first substrate supporting portion are explained in detail. As shown in FIG. 1, each of the two wafer holding pads 2 has a shape of an elongated block. The two wafer holding pads 2 are attached on center portions of corresponding pad-supporting rods 21 so as to be in parallel with each other. The wafer holding pads 2 are adapted to contact a back surface neighboring the circumference of the wafer (a first area). The wafer holding pads 2 have plural through holes 2*a* as shown in FIG. 2 and serve as a vacuum chuck that draws the wafer onto the top surface of the wafer holding pads 2 using a suction tube (described later) connected to the through holes 2*a*. In addition, as shown in FIG. 1, the pad supporting rods 21 are attached at their ends on corresponding bridging beams 22. With such a configuration, a frame 20 having substantially a rectangular shape is formed above the under cup 43.

Both ends of the two bridging beams 22 are fixed on corresponding belts 23. The two belts 23 are wound around corresponding pairs of spindles (or pulleys) 24. The two pairs of the spindles 24 are rotatably attached on corresponding side plates 26. The side plates 26 are securely provided so as to face corresponding side walls of the under cup 43 in parallel. In FIG. 1, these side walls are perpendicular to a Y direction shown in the drawing. To one of the spindles 24 is connected a driving mechanism 25 that can rotate the spindle 24 in clockwise and counter-clockwise directions, which in turn moves the belts 23. In such a manner, the frame 20 can reciprocally shift along an X direction shown in FIG. 1 above the under cup 43.

By the way, since the pad-supporting rod 21 of the frame 20 extends along the X direction and the wafer holding pads 2 are attached so that the longitudinal directions of the pad 2 and the pad-supporting rod 21 coincide with each other, the wafer holding pad 2 moves along its longitudinal direction (the X direction).

Moreover, the side plates 26 are supported at their bottom surfaces by corresponding elevating mechanisms 27, each of which is composed of a slider 27*a* and a guide rail 27*b*, as shown in FIG. 1. The elevating mechanisms 27 are fixed on a floor of a chassis of the cleaning apparatus 1. One of the elevating mechanisms 27 is provided with a driving mechanism 27*c* that can move the slider 27*a* up and down slidably within the guide rail 27*b*, thereby moving the frame 20 (along a Z direction in FIG. 1) up and down.

Referring to FIG. 1, a ring-shaped upper cup 41 is placed on the frame 20. The upper cup 41 receives cleaning liquid that is supplied to the back surface of the wafer W placed within the upper cup 41 (see FIG. 3) and spun off from the back surface of the wafer W, so as to prevent the cleaning liquid from being blown away. The upper cup 41 has an upper opening 41*a* having a larger diameter than the diameter of the wafer W, which allows the wafer W to be transferred into the upper cup 41 through the upper opening 41*a*. By the way, since the upper cup 41 is placed on the frame 20, the upper cup 41 can move in the X and the Z directions shown in FIG. 1 along with the frame 20.

Next, the spin chuck 3 serving as the second wafer-supporting portion is described. The spin chuck 3 is shaped into a circular plate and adapted to contact a center portion (a second area) of the back surface of the wafer W so as to supports the wafer W. As clearly shown in FIG. 2, the spin chuck 3 is positioned in the middle of the two wafer holding pads 2 that are disposed in parallel with each other. Therefore, the first area of the back surface of the wafer W is not overlapped with the second area of the back surface of the wafer W. Referring to FIG. 3, the spin chuck 3 is connected to a driving mechanism (spin chuck motor) 33 via a spindle 3*b*. The spin chuck 3 can rotate and go up/down powered by the spin chuck motor 33. In addition, the spin chuck 3 is provided with plural holes 3*a* that are in communication with a suction tube (not shown). Similar to the wafer holding pad 2, the spin chuck 3 serves as a vacuum wafer chuck that holds the wafer W on the top surface of the spin chuck 3 by suction using the suction tube.

Next to the spin chuck 3, supporting pins 32 are provided so as to be connected to an elevating mechanism 32*a*. The supporting pins 32 are configured to support the back surface of the wafer W so as to move the wafer W up and down. The elevating mechanism 32*a*, the supporting pins 32, and the transporting portion ("D2" in FIG. 5A) cooperate to transfer the wafer W from the transporting portion to the wafer holding pads 2 and vice-versa.

Figure 4:
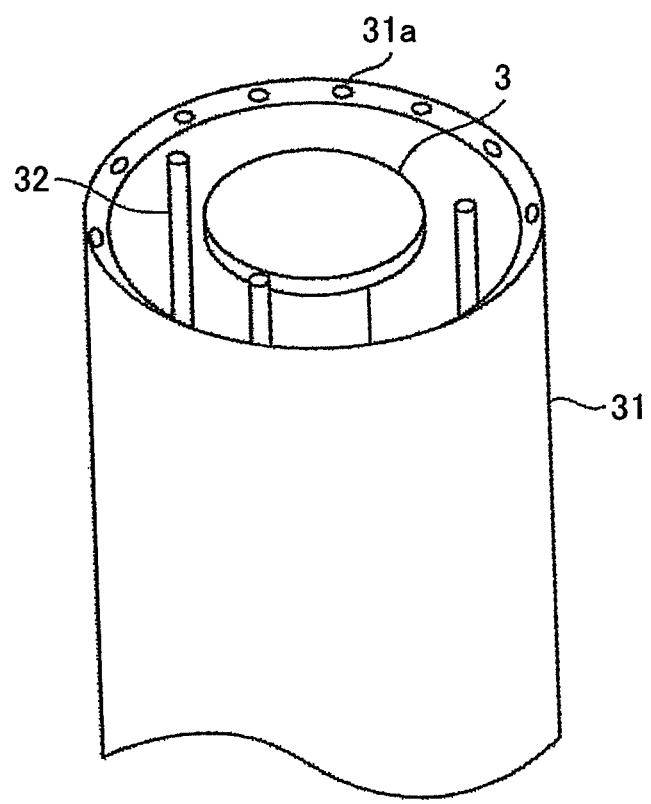
FIG. 4 is a perspective view of an air knife in the cleaning apparatus shown in FIG. 1.
Figure 6:
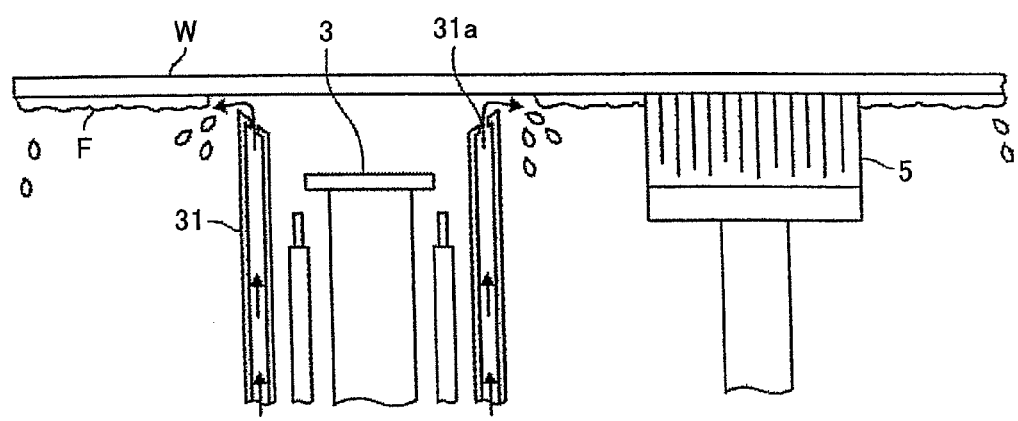
FIG. 6 is a schematic diagram showing operations of the air knife shown in FIG. 4, when a back surface of a substrate is cleaned.

As shown in FIG. 4, an air knife 31 having a cylindrical shape is located so as to enclose the spin chuck 3 and the supporting pins 32. The air knife 31 has at its top end plural ejection orifices 31*a* arranged along a circumferential direction. The air knife 31 ejects gas, for example, pressurized air or the like supplied from a gas supplier (not shown) toward the back surface of the wafer W from the ejection orifices 31*a* so as to blow off a cleaning liquid on the back surface. Namely, the air knife 31 serves as a dryer to dry the top surface of the spin chuck 3 and the back surface to be contacted by the spin chuck 3 (the second area). By the way, the air knife 31 is preferably composed of a dual cylinder having a hollow space between the two cylindrical walls, as shown in FIG. 6. With this configuration, the air knife 31 can eject the gas from the ejection orifices 31*a* through the hollow space.

Next, the brush 5, which serves as a contact portion that contacts and cleans the back surface of the wafer W, is described. The brush 5 is composed by bundling, for example, plural plastic strings into a cylindrical column. The plastic strings may be made of, for example, polyvinyl chloride (PVC), urethane, nylon, or the like. The brush 5 is rotatably attached at the distal end of the supporting portion 51. The supporting portion 51 has a ladle-like shape so as to avoid colliding with the wafer W and the bridging beams 22. The base end of the supporting portion 51 is fixed on a belt 52 wound around a pair of spindles (or pulleys) 53 (FIG. 1) that are rotatably attached on one of side walls extending along the Y direction. One of the spindles 53 is connected to a driving mechanism 54 (FIG. 1), which rotates the spindle 53 and moves the belt 52 in clockwise and counter clockwise directions. In such a manner, the supporting portion 51 and thus the brush 5 can move reciprocally along the Y direction shown in FIGS. 1 through 3.

In addition, a rotating mechanism (not shown) is provided at the distal end of the supporting portion 51 so as to rotate the brush 5. Therefore, the brush 5 can contact or be pressed onto the back surface of the wafer W and rotate so as to remove particles on the back surface. Moreover, a cleaning liquid nozzle 5*a* and a blowing nozzle 5*b* are provided at the distal end of the supporting portion 51. The cleaning liquid nozzle 5*a* supplies the cleaning liquid, for example, deionized water or purified water so as to wash away the particles removed by the brush 5. The blowing nozzle 5*b* ejects gas, for example, nitrogen ($N_2$) so as to facilitate drying the back surface of the wafer W after the back surface is cleaned.

Referring back to FIG. 3, the under cup 43 has at its bottom portion a drain pipe 16 for discharging from the under cup 43 the cleaning liquid received by the under cup 43 and an exhaust pipe 15 through which the air inside the under cup 43 flows out. The exhaust pipe 15 protrudes upward from the bottom of the under cup 43 in order to prevent the cleaning liquid remaining in the bottom from flowing into the exhaust pipe 15. In addition, a ring-shaped inner cup 42 is attached around the air knife 31 so as to be placed over the exhaust pipe 15 in order to prevent the cleaning liquid from dribbling into the exhaust pipe 15.

By the way, a blowing nozzle 13 is provided above the upper cup 41. The blowing nozzle 13 ejects gas, for example, pressurized air toward the top circumferential area of the wafer W from above. The blowing nozzle 13 is connected to an elevating mechanism (not shown), which makes it possible for the blowing nozzle 13 to move upward so as not to touch the wafer W and the transporting portion D2 (FIG. 5A) when the wafer W is being transferred into and out from the cleaning apparatus 1.

Referring to FIG. 3 again, a cleaning liquid nozzle 14 is provided next to the air knife 31. The cleaning liquid nozzle 14 supplies the cleaning liquid toward the back surface of the wafer W in substantially the same manner as the cleaning liquid nozzle 5*a* located at the distal end of the supporting portion 51.

In addition, a lamp box 11 that houses a UV lamp 12 is attached on a side wall of the under cup 43, next to which no belts are provided. The wafer W is transferred into and out from the cleaning apparatus 1, passing over the UV lamp 12. Therefore, the UV lamp 12 can emit ultraviolet light toward the back surface of the wafer W, while the wafer W is being transferred out from the cleaning apparatus 1, so as to shrink particles remaining, if any, on the back surface of the wafer W.

Referring to FIG. 2, the cleaning apparatus 1 is provided with a controller 6. The controller 6 controls the entire operation of the cleaning apparatus 1. The controller 6 may be a computer having a program storing portion (not shown). The program storing portion stores a computer program including steps (instructions) of causing each element for the cleaning apparatus 1 to perform predetermined cleaning operations described later in reference to FIGS. 5A through 5E and 10A through 10C. The controller 6 retrieves the computer program from the program storing portion and controls the elements in accordance with the program. In addition, the controller 6 controls the transporting portion (not shown), the wafer holding pads 2, and the spin chuck 3 so as to allow the wafer W to be transferred, and the brush 5 so as to clean the back surface of the wafer W. Moreover, the driving mechanisms 25, 54, the UV lamp 12, and a pressure controller (not shown) provided in the exhaust pipe 15 are also controlled by the controller 6.

By the way, the computer program is saved in a computer readable storage medium, such as a hard disk, a CD-ROM/RAM, a magneto-optical disk, various memory cards, a USB memory, or the like, and stored in the program storing portion.

Figure 7:
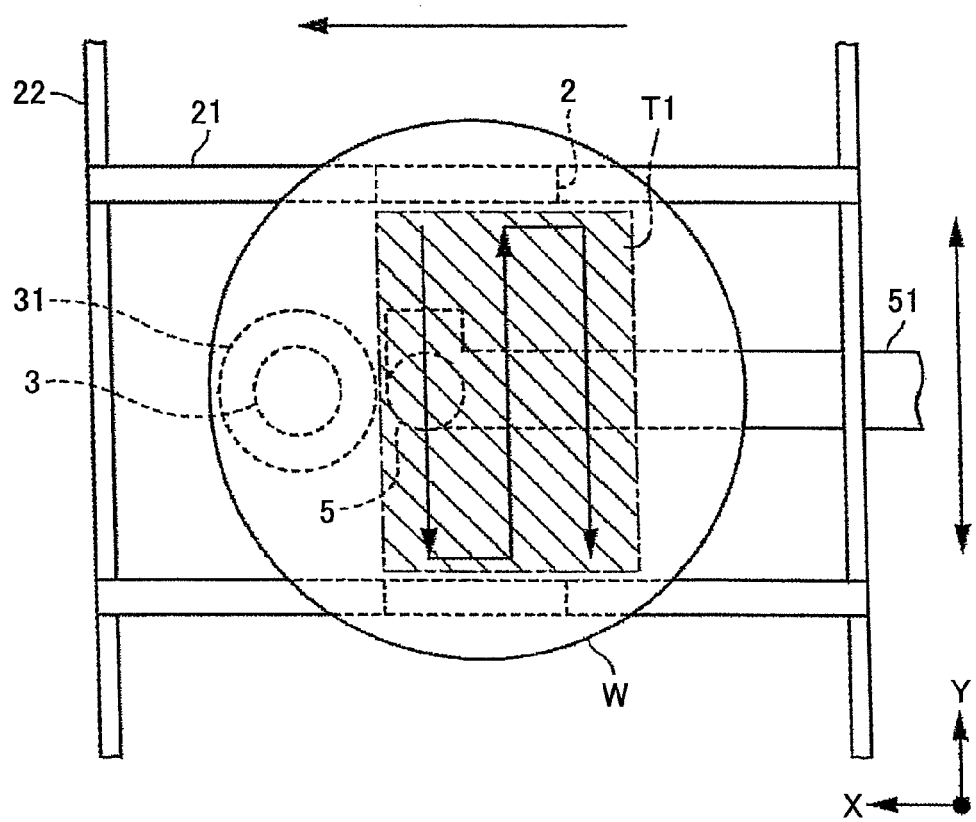
FIG. 7 is a schematic diagram showing a brush movement in relation to the substrate, when the back surface is cleaned.
Figure 8:
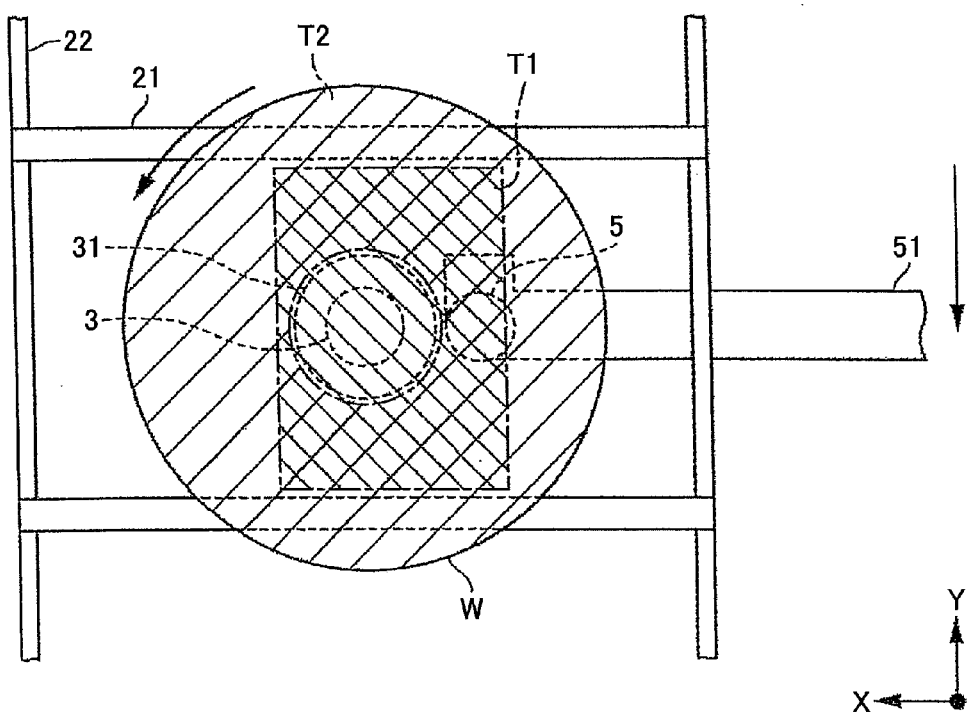
FIG. 8 is a cleaned area of the back surface of the substrate.

Next, cleaning operations performed by the cleaning apparatus 1 having the above configuration are described, in reference to FIGS. 5A through 8. FIGS. 5A through 5E are cut-away side views of the cleaning apparatus 1 at each step of cleaning the back surface of the wafer W. FIG. 6 is an explanatory view illustrating a spatial relationship between the wafer W, the air knife 31, the spin chuck 3, and the brush 5. FIGS. 7 and 8 are plan views for illustrating schematically areas to be cleaned. By the way, the UV lamp 12, the blowing nozzle 13, and the like are omitted in these drawings for simplicity of illustration.

Figure 5A:
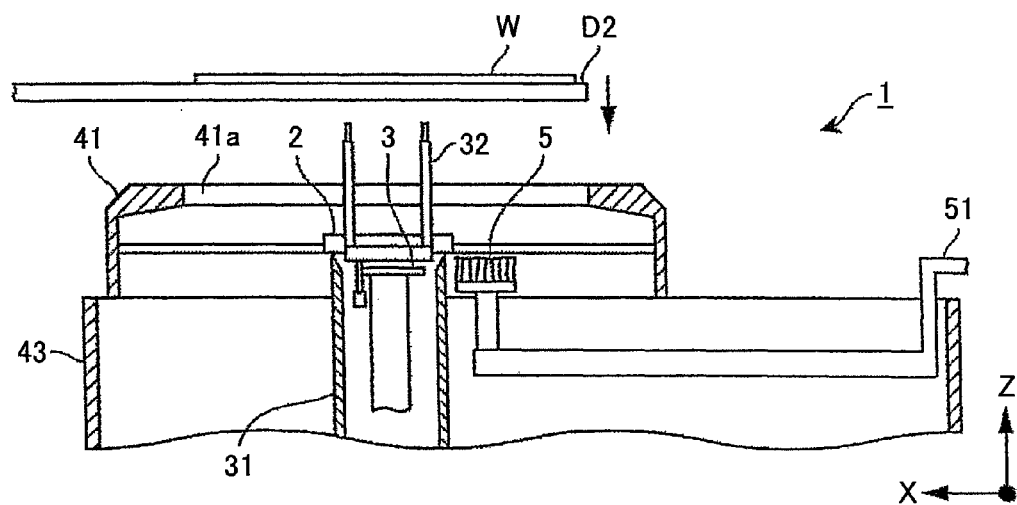
FIGS. 5A through 5E are cut-away side views illustrating cleaning operations of the cleaning apparatus shown in FIG. 1.
Figure 5B:
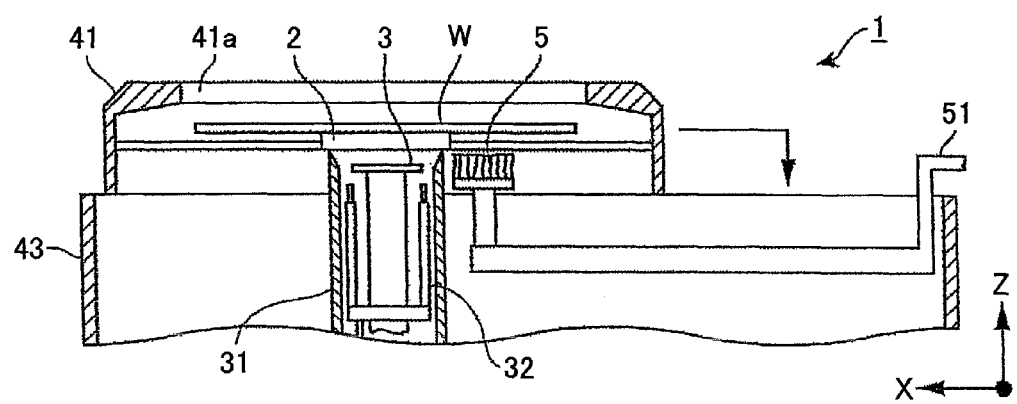

As shown in FIG. 5A, the transporting portion (transfer arm) D2 having a top view shape of "U" (or "C") at the end transports the wafer W to be cleaned to the cleaning apparatus 1 and stops at a standby position so as to keep the wafer W above the upper opening 41*a* of the upper cup 41. Next, the supporting pins 32 move upward and come to rest below the transporting portion D2. Then, the transporting portion D2 moves downward from the standby position so as to allow the wafer W to rest on the supporting pins 32, and subsequently retreats from the cleaning apparatus 1. At this time, the upper ends of the wafer holding pads 2 are positioned below the wafer W supported by the supporting pins 32 and above the upper end of the brush 5. In addition, the upper surface of the spin chuck 3 is positioned below the upper end of the brush 5. Subsequently, when the supporting pins 32 move downward, the wafer W is transferred onto the wafer holding pads 2 (FIG. 5B).

Figure 5C:
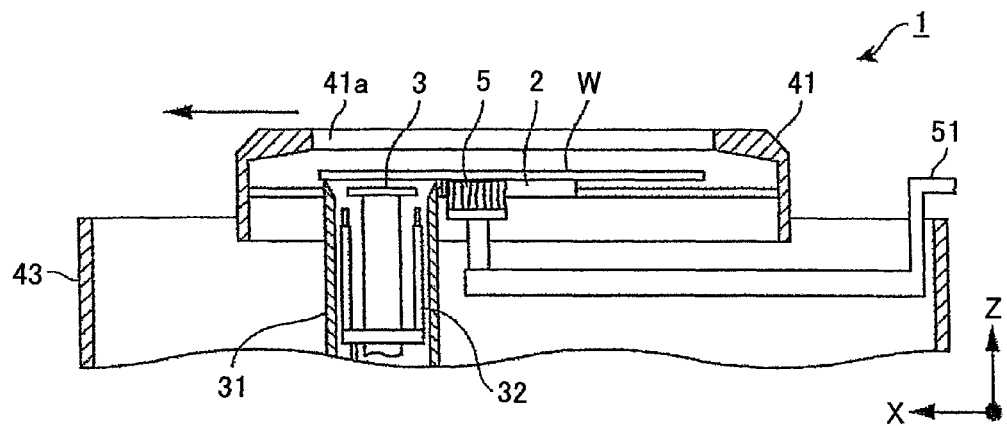
Figure 5D:
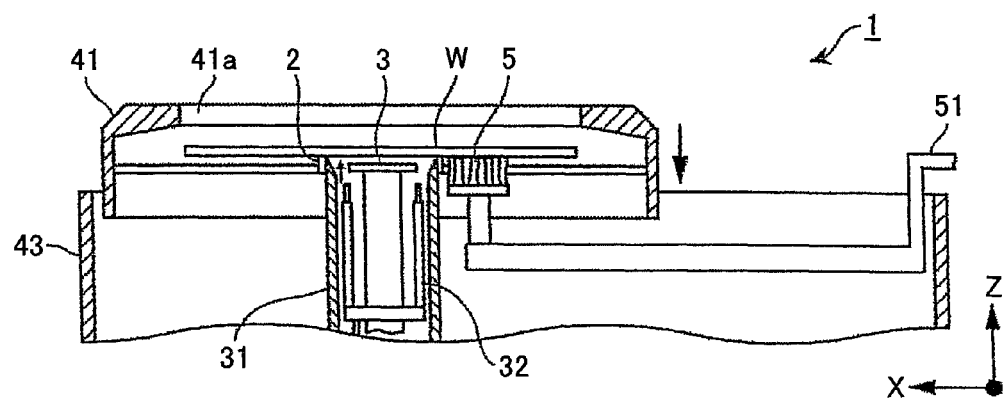

Then, the wafer holding pads 2 hold the wafer W by suction so that the wafer cannot be raised even when the brush 5 is pressed on the back surface of the wafer W. After this, the wafer holding pads 2 are moved to the right, while keeping suction on the wafer W and stop so that the leftmost edge of the wafer W is positioned, for example, above the leftmost edge of the air knife 31. Subsequently, the wafer holding pads 32 move downward so as to allow the back surface of the wafer W to touch the brush 5 (FIG. 5C).

Next, after the gas is blown out from the ejection orifices 31*a* of the air knife 31, the cleaning liquid is ejected out from the nozzle 5*a* at the distal end of the support portion 51 toward the back surface of the wafer W and the brush 5 is rotated, so as to start cleaning the back surface of the wafer W. At this time, the gas blown out from the ejection orifices 31*a* of the air knife 31 can prevent the cleaning liquid from splashing on the top surface of the spin chuck 3. While the back surface of the wafer W is being cleaned, the wafer holding pads 2 and the brush 5 cooperatively move so as to clean a wider area of the back surface of the wafer W. Specifically, while the brush 5 is reciprocating in the Y direction as shown in FIG. 7, the wafer holding pads 2 shift toward the left in the X direction by a distance smaller than the diameter of the brush 5 when the brush 5 reverses the directions. Due to such movements, the brush 5 can trace a zigzag track on the back surface of the wafer W as shown by an arrow sequence in FIG. 7. As a result, a shaded area T1 in FIG. 5 is evenly cleaned.

When the back surface of the wafer W is being cleaned, while a small portion of the cleaning liquid from the cleaning liquid nozzle 5*a* remains almost entirely on the back surface so as to form a liquid layer F as shown in FIG. 6, the majority of the cleaning liquid dribbles down from the back surface of the wafer W so as to wash away the particles removed from the back surface by the brush 5 to the under cup 43. The ejection orifices 31*a* of the air knife 31 eject the gas so as to blow away the cleaning liquid or the fluid layer F on the back surface of the wafer W, so that the area of the back surface, which faces the air knife 31, is dried. In addition, the cleaning liquid is also prevented from moving inward to the spin chuck 3 by the gas ejected from the ejection orifices 31*a*. As a result, the top surface of the spin chuck 3 is kept dry, thereby avoiding contamination or water marks on the top surface of the spin chuck 3 caused by the cleaning liquid used to clean the back surface of the wafer W.

After the area T1 is cleaned, the wafer holding pads 2 are moved back to the left so as to bring the center of the wafer W in line with the center of the spin chuck 3 (FIG. 5D), and then the wafer W is transferred from the wafer holding pad 2 to the spin chuck 3 specifically in the following manner.

First, the brush 5 stops shifting and rotating while the gas is still being ejected from the air knife 31, and the cleaning liquid from the cleaning liquid nozzle 5*a* at the distal end of the supporting portion 51 is stopped. Next, the wafer W is released from being fixed on the wafer holding pads 2, and the spin chuck 3 is raised so as to support the wafer W from the back side of the wafer W. Then, the wafer holding pads 2 are moved downward and thus the wafer W is now placed on the spin chuck 3. The spin chuck 3, which has received the wafer W from the wafer holding pads 2, is positioned at substantially the same elevation as the wafer holding pads 2, and draws the wafer W so as to fix the wafer W at the elevation.

Figure 5E:
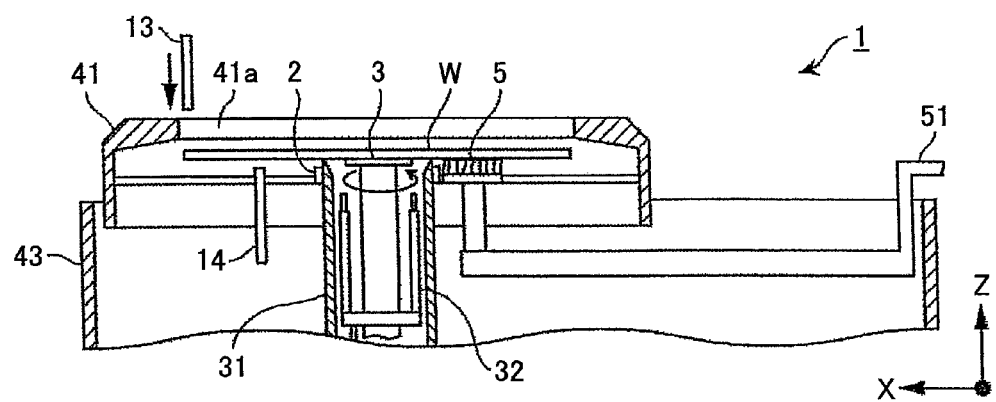

Thus, the brush 5 now can be pressed onto the back surface of the wafer W. Then the brush 5 starts rotating, the cleaning liquid is supplied to the back surface of the wafer W from the cleaning liquid nozzle 5*a* at the distal end of the supporting portion 51, and furthermore the spin chuck 3 starts rotating. This is how cleaning the back surface of the wafer W is resumed (FIG. 5E). Specifically, the brush 5 is shifted toward the circumference of the wafer W and positioned so as to clean the outermost area of the back surface of the wafer W. Next, the wafer W is slowly rotated by the spin chuck 3. Then, when the wafer W is rotated, for example, by 360 degree, the brush 5 is shifted toward the spin chuck 3 by a length corresponding to a diameter or less of the brush 5. When such operations are repeated, the brush 5 cleans the back surface of the wafer W, moving along a concentric path on the back surface. Therefore, an area T2 marked with diagonal lines rising from left to right (hatching) in FIG. 8 can be evenly cleaned.

As shown in FIG. 8, the cleaned areas T1, T2 completely cover the back surface of the wafer W without leaving unclean areas, which is realized by adjusting in advance, for example, the size and operations of each element of the cleaning apparatus 1. In addition, when the back surface of the wafer W supported by the spin chuck 3 is being cleaned, not only the cleaning liquid nozzle 5*a* next to the brush 5 but also the cleaning liquid nozzle 14 next to the air knife 31 (FIG. 5E) ejects the cleaning liquid toward the back surface of the wafer W. Therefore, the area T2 is surely wet with the cleaning liquid during the cleaning. This is advantageous in that water marks are prevented from being caused, since the water marks generally appear more often after the back surface of the wafer W is dried if the wafer surface has been partly wet and dry.

After cleaning the back surface of the wafer W is completed in the above manner, the brush 5 stops rotating; the cleaning liquid nozzle 5*a* stops supplying the cleaning liquid; and the spin chuck 3 stops rotating. Then, the spin chuck 3 starts spinning so as to spin off the cleaning liquid on the back surface of the wafer W. Since the cleaning liquid distributed evenly on the back surface as stated above is suddenly spun off, the wafer marks can be prevented from being caused.

When the spin chuck 3 is spinning, the blowing nozzle 13 is lowered so as to blow the gas toward the top circumferential area of the wafer W and the blowing nozzle 5*b* next to the brush 5 is positioned right below the back circumferential area of the wafer W so as to blow the gas toward the back circumferential area. Since the gases are blown toward both circumferential areas of the wafer W from above and below, drying the cleaning liquid is facilitated. By the way, since the second area of the back surface of the wafer W is contacted by the top surface of the spin chuck 3, the second area cannot be dried by spinning the wafer W. However, since the second area and the top surface of the spin chuck 3 are dried, or kept dried by the air knife 31, the second area may be free from the water marks.

After cleaning and drying the back surface of the wafer W are completed as explained above, the wafer W is transferred to the transporting portion D2 (FIG. 5A) in an opposite way of transferring the wafer W to the cleaning apparatus 1. When the wafer W is being transferred out, the UV lamp 12 is turned on so as to emit ultraviolet light toward the back surface of the wafer W that is being supported by the transporting portion D2 (FIG. 5A) whose wafer-supporting end is U-shaped. Even if particles remain on the back surface of the wafer W, since the UV light can decompose organic substances, the particles which may originate from the photoresist can be shrunk and removed from the back surface by the UV light, thereby facilitating elimination of the defocusing problem.

In parallel with transferring the wafer W from the cleaning apparatus 1, the wafer holding pads 2 and the spin chuck 3 are moved back to standby positions, for example, the positions shown in FIG. 5A and wait for the next wafer to be transferred in. After the next wafer is transferred, the procedures explained in reference to FIGS. 5A through 8 are repeated, and in such a manner plural wafers are processed in series.

Second Embodiment

Figure 9:
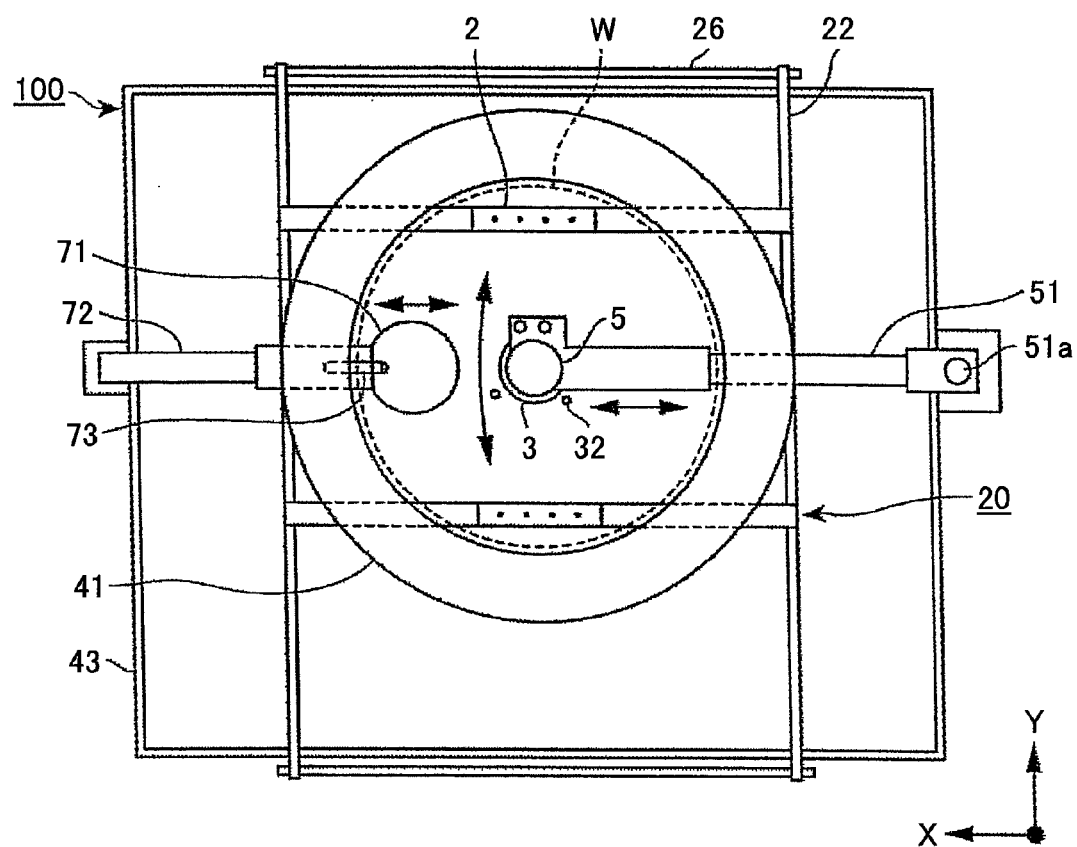
FIG. 9 is a plan view of a substrate cleaning apparatus according to a second embodiment of the present invention.

Referring to FIGS. 9 through 11, a cleaning apparatus according to a second embodiment of the present invention is described. FIG. 9 is a plan view of a cleaning apparatus 100 according to the second embodiment of the present invention. FIGS. 10 and 11 are cut-open side views of the cleaning apparatus 100. In these drawings, the same or corresponding reference marks used in FIGS. 1 through 8 are given to the same or corresponding members or components.

The cleaning apparatus 100 according to the second embodiment is different from the cleaning apparatus 1 according to the first embodiment in that the spin chuck 3 can be lowered further below the second area of the back surface of the wafer W whereas the wafer W can be horizontally shifted with respect to the spin chuck 3 in cleaning apparatus 1 of the first embodiment. In addition, the frame 20 is movable not in the X direction but only in the Z direction in the cleaning apparatus 100, in contrast to the cleaning apparatus 1. The elevating mechanism 27 (FIG. 1) that moves the frame 20 up/down, and the spin chuck motor 33 (FIG. 3) that moves the spin chuck 3 up/down serve as an elevating portion that can vertically move the spin chuck 3, which serves as the second wafer-supporting portion, in relation to the wafer holding pads 2, which serve as the first wafer-supporting portion. The brush 5 is attached at the distal end of the supporting rod 51, and the base end of the supporting portion 51 is fixed on the under cup 43. The supporting portion 51 is configured to be pivotable around a pivot 51a provided at the base end and retractable so as to elongate and contract, as shown in FIG. 9. Therefore, the brush 5 can clean the back surface of the wafer W from the center (the second area) to the wafer edge without moving the wafer W.

Figure 10A:
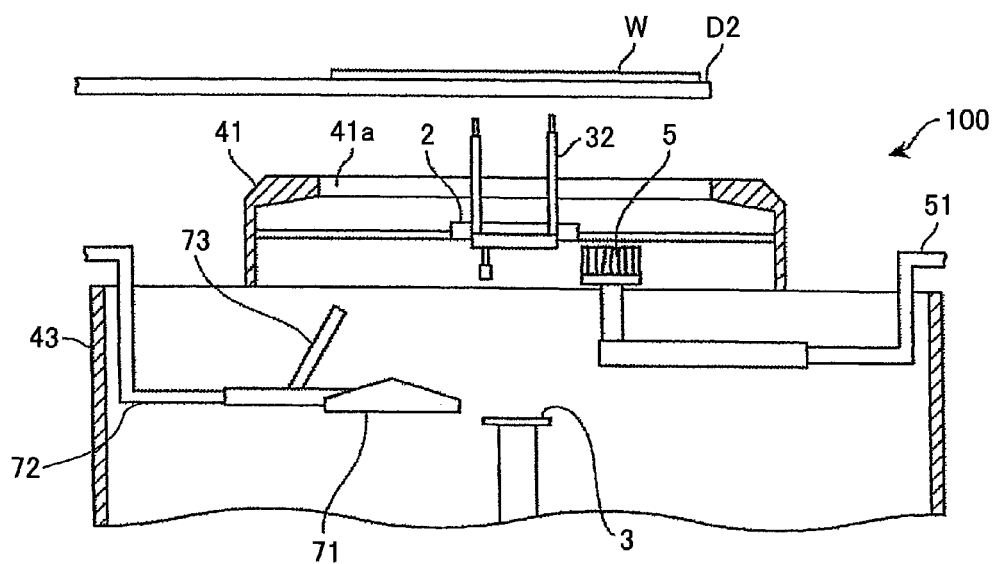
FIGS. 10A through 10O are cut-away side views illustrating cleaning operations of the cleaning apparatus shown in FIG. 1.

In addition, the cleaning apparatus 100 according to the second embodiment of the present invention includes a cover member 71 and a retractable supporting portion 72 for supporting the cover member 71 (see FIG. 10A). The cover member 71 is made of a water repellent material such as a fluorine resin or the like and has a diameter larger than or equal to the diameter of the top surface of the spin chuck 3. The base end of the supporting portion 72 is fixed on the top end of the side wall opposing the side wall where the base end of the supporting portion 51 is fixed. On the distal end of the supporting portion 72 is attached the cover member 71, which stays in a standby position (FIG. 10($a$)) when the supporting portion 71 is retracted and stays over the spin chuck 3 (FIG. 10($b$)) when the supporting portion 71 is extended. With such a configuration, the cover member 71 can prevent the cleaning liquid from dribbling down on the top surface of the spin chuck 3 when the back surface of the wafer W is being cleaned. In addition, the cover member 71 may have plural ejection orifices in other embodiments, so that gas such as $N_2$ or the like can be blown out in a downward direction from the ejection orifices. With these orifices, the top surface of the spin chuck 3 is preferably prevented from being wet with mist or droplets caused by the cleaning liquid when the back surface of the wafer W is being cleaned. Since the cleaning apparatus 100 according to this embodiment does not include the air knife 31, the ejection orifices of the cover member 71 are advantageous.

Moreover, the supporting portion 72 is provided with a drying nozzle 73 configured to blow gas toward the second area of the back surface of the wafer W. The drying nozzle 73 serves as a drying portion that dries the second area of the back surface of the wafer W.

Next, operations of the cleaning apparatus 100 according to the second embodiment of the present invention are described. Referring to FIG. 10A, when the wafer W is transferred, the spin chuck 3 is positioned at the lower portion of the under cup 43 and the cover member 71 is positioned at the standby position (an upper lateral position with respect to the spin chuck 3). Then, the supporting pins 32 receive the wafer W from the transporting portion D2 and place the received wafer W onto the wafer holding pads 2, which in turn draw the wafer W using a suction tube (not shown in FIG. 10A) so as to fix the wafer W on the top.

Figure 10B:
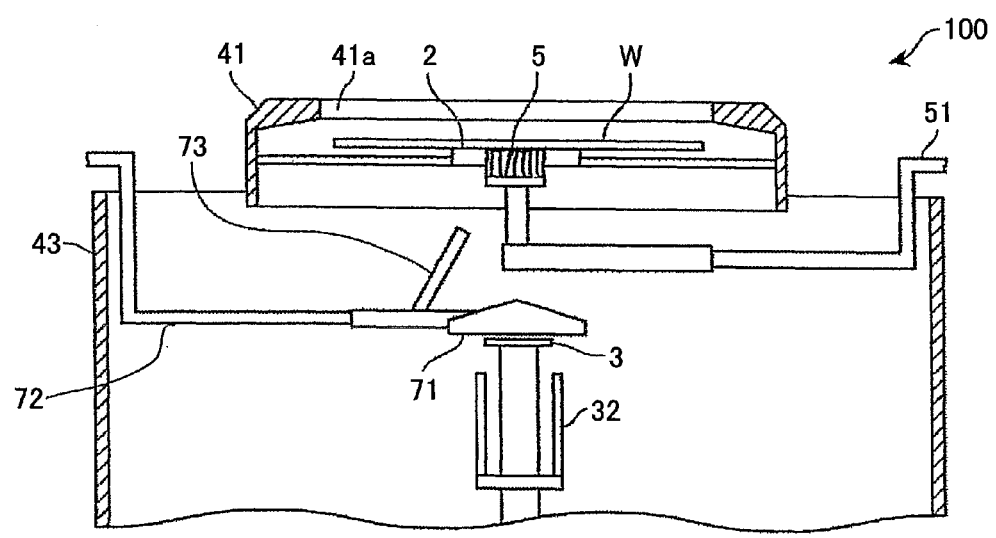

Next, as shown in FIG. 10B, the supporting pins 32 are lowered below the top surface of the spin chuck 3; the supporting portion 72 is extended so as to position the cover member 71 over the spin chuck 3; and the supporting portion 51 is elongated so as to position the brush 5 below the center area of the back surface of the wafer W. Then, the wafer holding pads 2 are lowered so that the brush 5 touches the back surface of the wafer W, and the center area, which is larger than the second area, is cleaned by rotating the brush 5 along with the cleaning liquid supplied toward the back surface from the cleaning liquid nozzle 5b. As stated above, since the cover member 71 covers the spin chuck 3, acting like an umbrella, and the gas may be blown out downward from the cover member 71 so as to blow the mist or the droplets away, the top surface of the spin chuck 3 is kept dry. After cleaning the center area of the back surface is completed, the supporting portion 51 is retracted so as to move the brush 5 toward the edge portion of the wafer W. Then, the drying nozzle 73 starts blowing the gas toward the second area, which is thus dried.

Figure 10C:
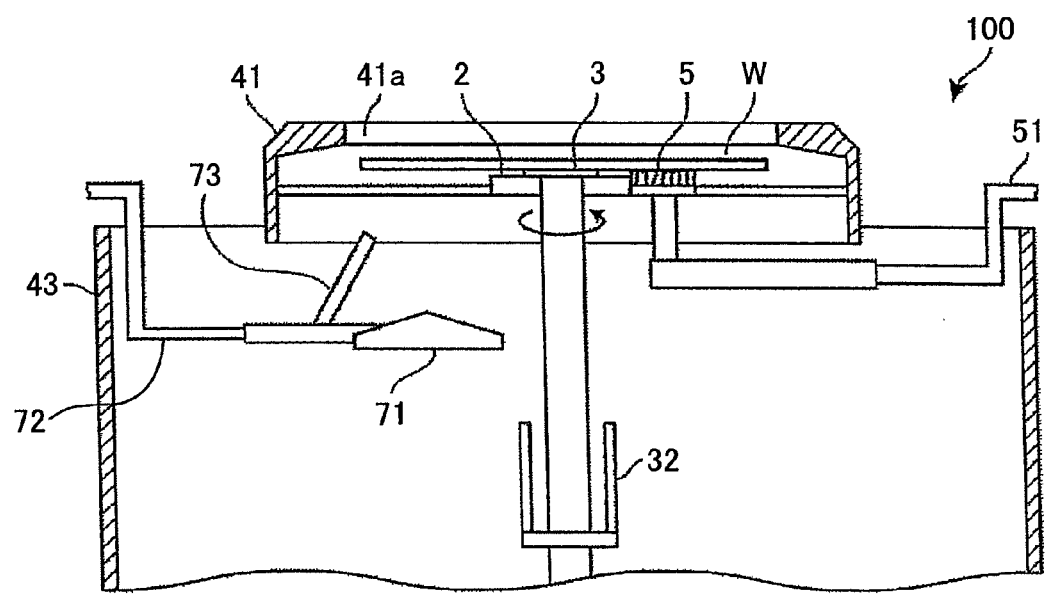

After the second area of the back surface of the wafer W is dried, the cover member 71 is moved back to the standby position. Next, the spin chuck 3 is raised so that the top surface of the spin chuck 3 touches the cleaned and dried second area, and the wafer W is passed from the wafer holding pads 2 to the spin chuck 3, which then tightly holds the wafer W by suction. Then, the wafer W is slowly rotated by the spin chuck 3 and the brush 5 is rotated and shifted by the supporting portion 51 that can be extended/contracted and is pivotable around the pivot 51a (FIG. 9) of the supporting portion 51. This is how the back surface of the wafer W is cleaned, specifically, the area of the back surface that has not yet been cleaned (FIG. 10C). By the way, the supporting pins 32 which stay in the lower portion of the under cup 43 are preferably prevented from being wetted with the cleaning liquid, for example, by housing the pins 32 in a capsule or the like (not shown).

After the above cleaning is completed, the wafer W is spun by the spin chuck 3 so that the cleaning liquid on the back surface of the wafer W is spun off and the back surface becomes dry. Then, procedures opposite to the procedures performed when the wafer W is transferred into the cleaning apparatus 100 are performed so that the wafer W is passed from the spin chuck 3 to the supporting pins 32 and thus to the transporting portion D2, and transferred out from the cleaning apparatus 100. By the way, it is obvious that the UV lamp 12 (FIGS. 1 through 3) may be used (turned on) also in this embodiment when the wafer W is being transferred out from the cleaning apparatus 100.

According to the cleaning apparatuses 1, 100 of the embodiments of the present invention, since the back surface of the wafer is cleaned while the wafer is supported from the back surface, there is no need for a reverser that reverses the wafer for the purpose of cleaning the back surface of the wafer, which eliminates the space required to implement the reverser and the space required to reverse the wafer in the cleaning apparatuses 1, 100. As a result, the coater/developer or the photolithography system can be made compact when the cleaning apparatuses 1, 100 according to the embodiments of the present invention are integrated into the coater/developer or the system, compared with the conventional coater/developer or photolithography system.

In addition, since the wafer W is transferred between the two substrate supporting portions (the wafer holding pads 2 and the spin chuck 3) that support different areas (the first and the second areas) of the back surface of the wafer W in the cleaning apparatuses 1, 100, there are no uncleanable areas. Therefore, there is no need for a mechanism for holding the edge of the wafer W for the purpose of eliminating such uncleanable areas. This is advantageous in that the wafer edge is prevented from being damaged, and thus particles or damage on the resist layer, or the like can be prevented, thereby increasing production yield.

In addition, the cleaning liquid on the wafer W can be spun off by the spin chuck 3, so that the wafer W is immediately dry in the cleaning apparatuses 1, 100 according to the embodiments of the present invention. Moreover, the area (the second area) to be contacted with the spin chuck 3 and the top surface of the spin chuck 3 are kept dried by the air knife 31 positioned so as to enclose the spin chuck 3 in the cleaning apparatuses 1, 100. These mechanisms can prevent water marks from being made on the back surface of the wafer W and the top surface of the spin chuck 3, thereby keeping the back surface uncontaminated.

By the way, while the cleaning apparatuses 1, 100 employ the brush 5, which has a high cleaning performance, the cleaning member is not limited to the brush 5 in the present invention. For example, other types of cleaning members that can eject the cleaning liquid or the like toward the back surface of the wafer so as to remove particles on the back surface can be employed instead of the brush 5. Such cleaning members may be a dual-fluid nozzle, a jet nozzle, a mega-sonic nozzle, or the like. In addition, although the brush 5 is of rotating type in the above embodiments, a brush of vibrating type can be used. Moreover, in other embodiments, the cleaning member may be composed of PVC sponge, urethane sponge, nylon sponge, or the like. Furthermore, the cleaning liquid is not limited to the deionized water or the purified water but other liquids can be used.

Additionally, while the cleaning apparatuses 1, 100 include 2 types of substrate supporting portions (the wafer holding pads 2 and the spin chuck 3), the cleaning apparatuses 1, 100 may have three or more substrate supporting portions. For example, when the cleaning apparatuses 1, 100 have three substrate supporting portions I, II, and III (not shown), the wafer can be transferred twice, that is, from the substrate supporting portion I to the substrate supporting portion II, and from the substrate supporting portion II to the substrate supporting portion III. In this case, the substrate supporting portions II, III are considered as the first and the second substrate supporting portions, respectively.

Figure 12:
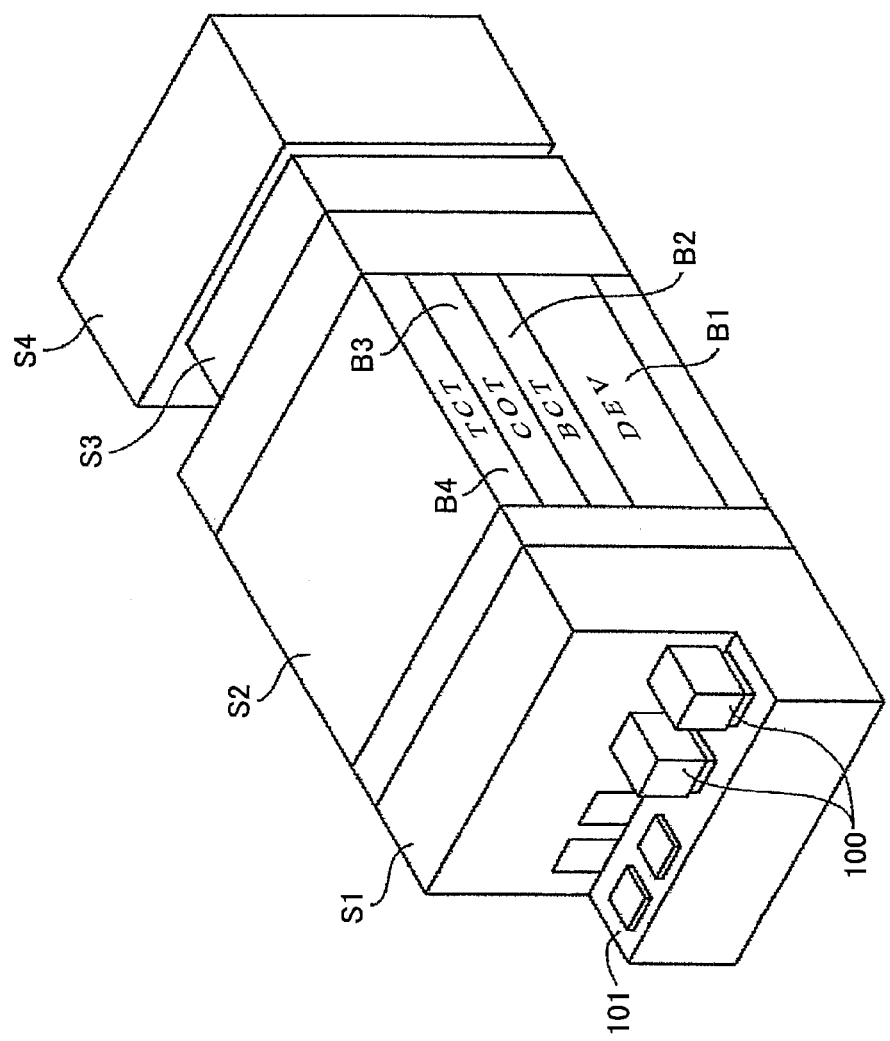
FIG. 12 is a schematic diagram of the coater/developer shown in FIG. 11.
Figure 13:
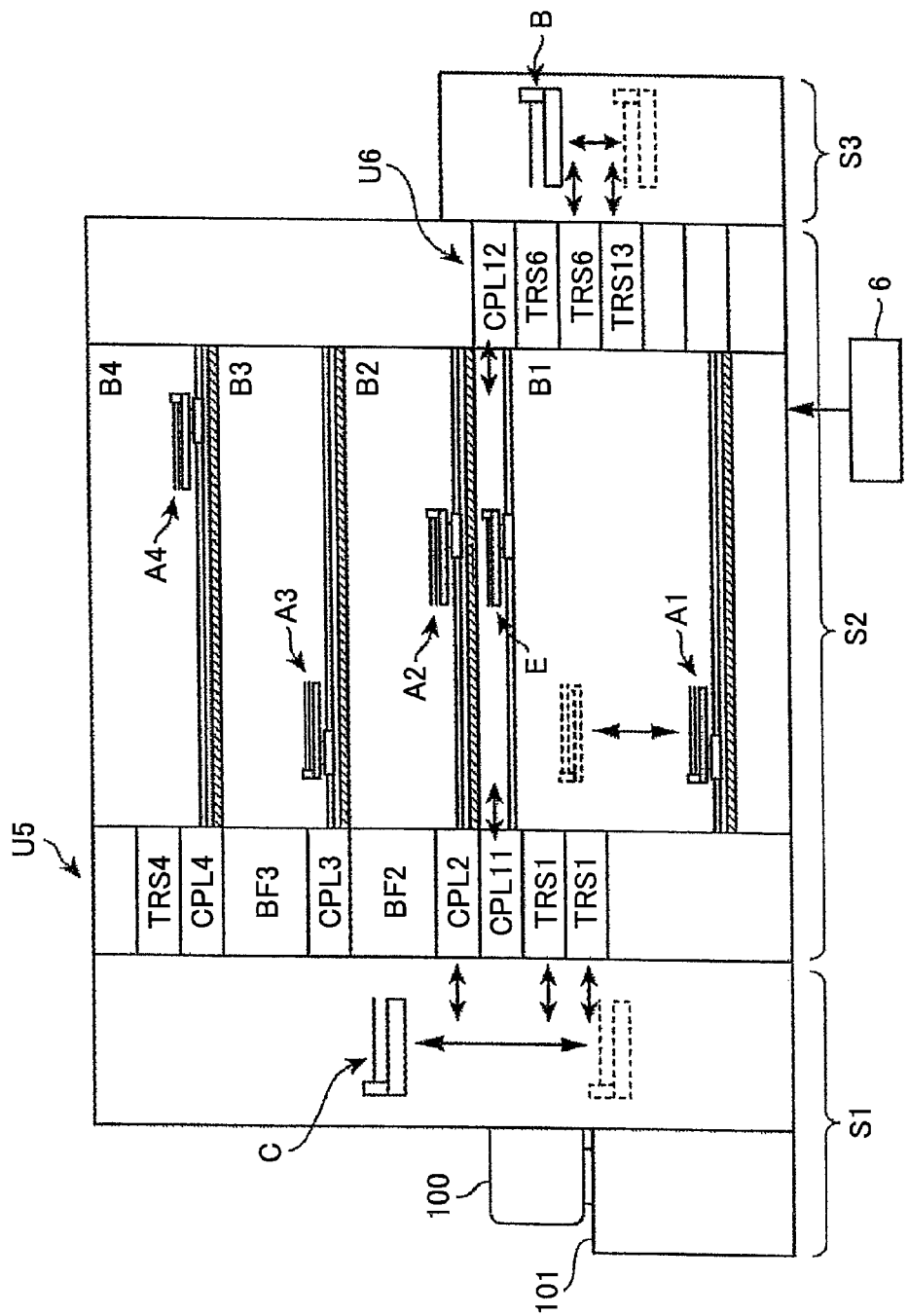
FIG. 13 is a cut-away side view of the coater/developer shown in FIG. 11.

Next, a coater/developer system including the cleaning apparatus 1 (or 100) according to the embodiment of the present invention is described. FIG. 11 is a plan diagram of the coater/developer system to which an exposure apparatus S4 is added; FIG. 12 is a perspective diagram of the system with the exposure apparatus S4; and FIG. 13 is a cross-sectional diagram of the system. As shown in these drawings, the coater/developer system is constructed to include a process block S2 with a carrier block S1 is attached in front and an interface block S3 attached in back. In addition, the exposure apparatus S4 is connected to the interface block S3. In the carrier block S1, there are provided four carrier stages 101 on each of which a closed-type wafer carrier 100 can be placed, and a transfer arm C that transfers the wafer W between the wafer carriers 100 and the process block S2.

The cleaning apparatus 1 according to the first embodiment of the present invention is located in the back of the process block S2 as shown in FIG. 11. In other words, the cleaning apparatus 1 is located next to the interface block S3, so that the cleaning apparatus 1 cleans the back surface of the wafer W that has undergone predetermined processes prior to the wafer W reaching the cleaning apparatus 1; then the cleaned wafer W is transferred to the interface block S3.

As shown in FIG. 12, the process block S2 is composed of a first block (developer (DEV) layer) B1 to be used to develop the resist film, a second block (bottom coat (BCT) layer) B2 that is located above the DEV layer B1 and used to form a bottom anti-reflection film on the wafer W, a third layer (coat (COT) layer) B3 that is located above the BCT layer B2 and used to form the resist film on the bottom anti-reflection film, and a fourth layer (top coat (TCT) layer) B4 that is located above the COT layer B3 and used to form a top anti-reflection film on the resist film.

The BCT layer B2 and the TCT layer B4 each have a spin-coat unit configured to dispense and spin-coat a chemical agent so as to form an anti-reflection film from the chemical agent on the wafer W, a group of process units configured to perform pre- and post-processes for the anti-reflection film coating, the pre/post processes including baking and cooling the wafer W, and a transfer arm A2 (A4) that is located between the spin-coat unit and the process units and transfers the wafer therebetween. In addition, the COT layer B3 is configured in the same manner as the BCT layer B2 and the TCT layer B4, except that the COT layer B3 dispenses a photoresist solution instead of the chemical agent for the anti-reflection film.

On the other hand, as for the DEV layer B1, two developer units 110 shown in FIG. 11 are arranged one above the other in the DEV layer B1. In addition, there is provided a transfer arm A1 that transfers the wafer W between the two developer units 110. In other words, the transfer arm A1 is shared by the two developer units 110.

The process unit S2 further includes a shelf unit U5 as shown in FIGS. 11 and 13. The shelf unit U5 has various tiers of transfer units, through which the wafer W is transferred from the carrier block S1 to the layers B1 through B4 in the process block S2, and vice versa. For example, the wafer W from the carrier block S1 is transferred to a transfer unit CPL2, which corresponds to the BCT layer B2, by an elevatable transfer arm D1 (FIG. 11) located near the shelf unit U5. Then, the wafer W in the transfer unit CPL2 is transferred to each unit (the coat unit and the group of the units) in the BCT layer B2 by the transfer arm A2 of the BCT layer B2, in which the bottom anti-reflection film is formed on the wafer W.

After the bottom anti-reflection film is formed, the wafer W is transferred to a transfer unit BF2 by the transfer arm A2 and then transferred from the transfer unit BF2 to a transfer unit CPL3 of the shelf unit U5 by the transfer arm D1. Next, the wafer W is transferred to the COT layer B3 by the transfer arm A3 of the COT layer B3, in which the resist film is spin-coated on the bottom anti-reflection film on the wafer W. Then, the wafer W is transferred to a transfer unit BF3 of the shelf unit U5 by the transfer arm A3. After this, the wafer W may be coated on its photoresist film with the top anti-reflection film in the TCT layer B4. In this case, the wafer W on which the bottom anti-reflection film and the resist film are formed in this order is transferred from the transfer unit BF3 to a transfer unit CPL4 of the shelf unit U5 by the transfer arm D1, and then to the TCT layer B4 by the transfer arm A4, in which the top anti-reflection film is formed on the resist film. After the top anti-reflection film is formed, the wafer W is transferred back to the transfer unit TRS4 by the transfer arm A4.

Referring to FIGS. 11 and 13, inside the process block S2 are provided the transfer arm D2 and a shelf unit U6. The shelf unit U6 has four tiers of transfer units, through which the wafer W is transferred between the DEV layer B1 and the cleaning apparatus 1 and between the process block S2 and the interface block S3. The transfer arm D2 is located between the shelf unit U6 and the cleaning apparatus 1 as shown in FIG. 11 and serves as a transferring portion that transports the wafer W between the shelf unit U6 and the cleaning apparatus 1. In addition, the transfer arm D2 can horizontally rotate, move along a direction from the shelf unit U6 to the cleaning apparatus 1 and the opposite direction, and move upward/downward. Moreover, the transfer arm D2 includes a first fork that brings the wafer W to be cleaned into the cleaning apparatus 1 and a second fork that brings the cleaned wafer W from the cleaning apparatus 1.

In addition, a shuttle arm E is arranged in the upper portion of the DEV layer B1 as shown in FIG. 13. The wafer W can be transferred directly from the transfer unit CPL11 of the shelf unit U5 to a transfer unit CPL12 of the shelf unit U6 by the shuttle arm E.

Namely, the wafer W having the photoresist film (or the top anti-reflection film) on the top of it is transferred from the transfer unit BF3 (or TRS4) to the transfer unit CPL11 of the shelf U5 by the transfer arm D1 and then the wafer W in the transfer unit CPL11 is transferred directly to the transfer unit CPL12 of the shelf unit U6 by the shuttle arm E. Next, the wafer W is brought from the transfer unit CPL12 to the cleaning apparatus 1 by the first fork of the transfer arm D2. Then, the back surface of the wafer W is cleaned in the cleaning apparatus 1 as described above. Subsequently, the cleaned wafer W is transferred to and placed in a transfer unit TRS13 by the second fork of the transfer arm D2, and in turn brought to the interface block S3. By the way, the transfer units represented by "CPL" in FIG. 13 have a temperature controller that may cool the wafer W. In addition, the transfer units represented by "BF" in FIG. 13 are buffer units in which plural of the wafers W can be temporarily stored.

Next, the wafer W is transferred to the exposure apparatus S4 by an interface arm B (FIGS. 11 and 13) and then undergoes a predetermined exposure process. After the exposure is completed, the wafer W is transferred back to process block S2, specifically, to either one of transfer units TRS6 of the shelf unit U6. Then, the wafer W is transferred to either one of the developer units 110 in the DEV layer B1 by the transfer arm A1 and undergoes a development process. After the development is completed, the wafer W is transferred to a transfer unit TRS1 of the shelf unit U5. Finally, the wafer W is returned to the carrier 100 by the transfer arm C. By the way, units U1 through U4 shown in FIG. 11 are a group of thermal units, each of which is composed of a hot plate and a cold plate stacked one above the other.

By the way, the cleaning apparatus 1 (100) according to the embodiment of the present invention is located near the entrance of the interface block S3 in the coater/developer system as shown in FIGS. 11 through 13, but the location is not limited to this. For example, the cleaning apparatus 1 may be located near the entrance of the process block S2, specifically, next to the shelf unit U5, so as to clean the back surface of the wafer W before the anti-reflection film and the photoresist film are formed. In other embodiments, the cleaning apparatus 1 may be located in the interface block S3 or the carrier block S1.

In addition, the cleaning apparatus 1 (100) according to the embodiment of the present invention may be applied to not only the coater/developer but also various semiconductor fabrication apparatuses. For example, the cleaning apparatus 1 (100) is preferably applied to an annealing apparatus for use in an annealing process after an ion-implantation process. If this annealing process is carried out while particles remain on the back surface of the wafer, the particles may be transferred around to the top surface of the wafer during the annealing process, which may cause short-circuits in connection lines connected to transistors formed on the top surface of the wafer. Therefore, removing such particles before the annealing process by the cleaning apparatus 1 (100) according to the embodiment of the present invention can improve production yield.

Next, various elements preferable in further improving the cleaning performance by the cleaning apparatuses 1, 100 according to the first and the second embodiments of the present invention, respectively, are described in reference to FIGS. 14 through 22. In the following explanation, while the cleaning apparatus 1 according to the first embodiment of the present invention is illustrated by an example for simplicity of explanation, it is obvious that these additional elements can be implemented to the cleaning apparatus 100 according to the second embodiment. By the way, elements unnecessary for the following explanations are omitted in FIGS. 14 through 22, for simplicity of explanation.

Figure 14:
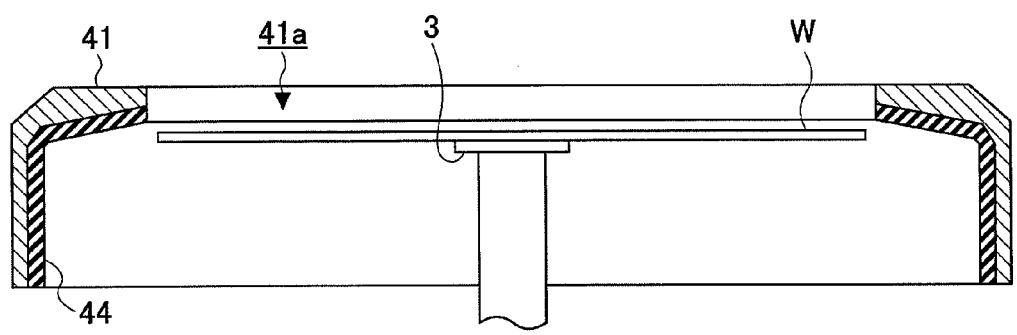
FIG. 14 is a cut-away side view of an upper cup of the cleaning apparatus according to the embodiments of the present invention, in which a lining member is attached on the inner surface of the upper cup.

In the cleaning apparatus 1 described in reference to FIGS. 1 through 11, the cleaning liquid spun off from the wafer W may collide with the inner wall of the upper cup 41 so as to produce mist or droplets, which may be suspended in the air and fall onto the top surface of the wafer W so as to contaminate the top surface. In order to prevent such contamination, the inner wall of the upper cup 41 is preferably made of a material that can prevent the cleaning liquid, which is spun off from the wafer by rotation, from being bounced from the inner wall so as to produce the mist or droplets. For example, a lining member 44 is attached on the inner wall of the upper cup as shown in FIG. 14, thereby preventing the mist or the droplets from being produced. Specific examples of materials of the lining member 44 may include a plastic porous material (porous resin) that has undergone a hydrophilic process such as addition of a hydrophilic agent or the like, a ceramic material such as alumina or the like whose surface is roughened by a blasting process, or the like. While attaching such a material on the inner wall of the upper cup 41 made of, for example, a polypropylene resin is advantageous, the upper cup 41 per se may be made of the above porous material or the ceramic material.

Figure 15:
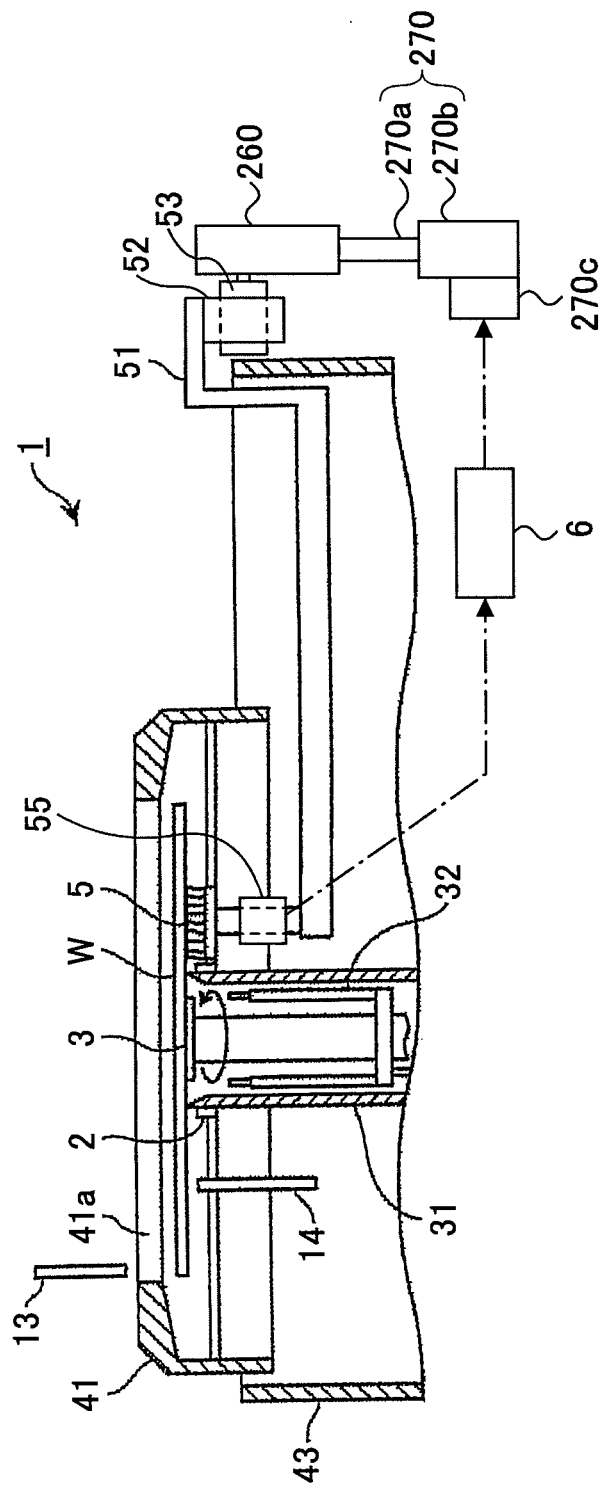
FIG. 15 is a cut-away side view of the cleaning apparatus provided with a cleaning pressure control mechanism.

In addition, as shown in FIG. 15, the cleaning apparatus 1 (100) may include a cleaning pressure controlling mechanism. This mechanism includes a measuring instrument 55 that measures pressure applied to the brush 5 or torque applied to the supporting portion 51 so as to ascertain the contact force generated between the brush 5 and the back surface of the wafer W in accordance with the measured pressure or torque, an elevating mechanism 270 that moves the supporting portion 51 up and down, and the controller 6. The elevating mechanism 270 can be configured in the same manner as the elevating mechanism 27 described in reference to FIG. 1. Specifically, the elevating mechanism 270 is described in the following. The base end of the supporting portion 51 is fixed on the belt 23, which is wound around the pair of the spindles (pulleys) 52. The spindles 52 are rotatably attached on a side plate 260, which is provided so as to face the side wall of the under cup 43. On the bottom of the side plate 260 is attached a slider 270a, which constitutes the elevating mechanism along with a guide rail 270b. One of the elevating mechanisms is provided with a driving mechanism 270c that can drive the slider 270a up and down within the guide rail 270b, thereby elevating the side plate 260 and thus the supporting portion 51 and the brush 5. According to the cleaning pressure controlling mechanism, the contact force between the brush 5 and the back surface of the wafer W can be maintained at a substantially constant value within a predetermined range by adjusting the height of the brush 5 in relation to the wafer W in accordance with the contact force obtained by the measuring instrument 55. Maintaining the constant contact force contributes to improved repeatability of particle removing performance (or rate). In addition, since excessive pressure is prevented from being applied on the back surface of the wafer W, the wafer W cannot be removed from the wafer holding pads 2 or the spin chuck 3 by the pressure.

By the way, the cleaning pressure controlling mechanism may be configured to include the elevating mechanism 27 (FIG. 1) for the wafer holding pads 2, or the spin chuck motor 33 (FIG. 3) for the spin chuck 3, instead of the elevating mechanism 270 for the brush 5. In such a configuration, the cleaning pressure controlling mechanism can control the contact force by adjusting the height of the wafer holding pads 2 or the spin chuck 3, in accordance with the measured contact force.

Figure 16:
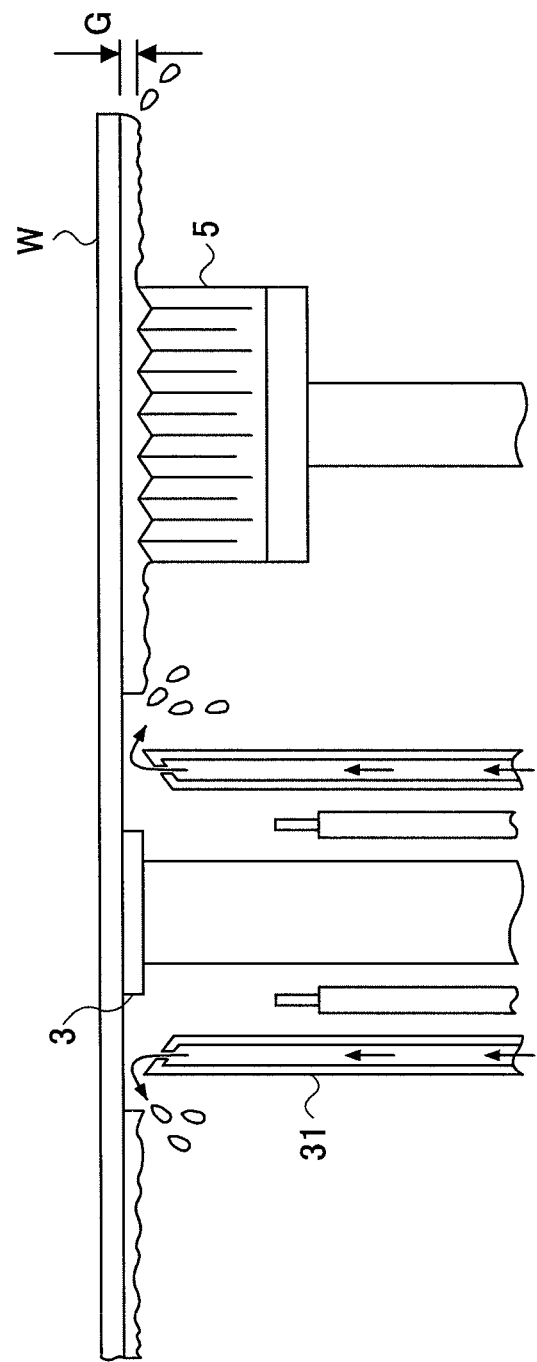
FIG. 16 is a schematic diagram of cleaning the back surface of the wafer using a brush located so as to leave a gap from the back surface.
Figure 17:
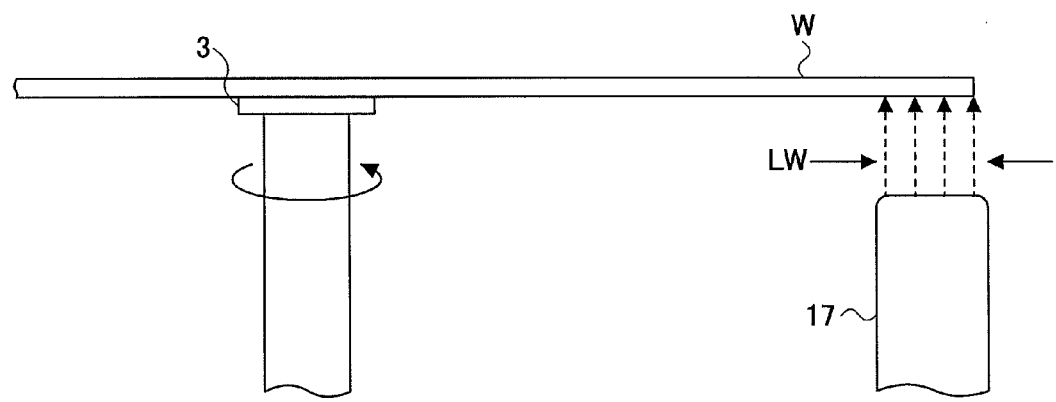
FIG. 17 is a diagram for explaining an ultraviolet light source that emits ultraviolet light onto a back circumferential area of the substrate.

The technique for cleaning the back surface of the wafer W using the brush 5 is especially advantageous when the back surface is hydrophilic. On the other hand, as far as the top surface of the wafer W is concerned, a hydrophobic process is performed by exposing the top surface to vapor of a hydrophobic agent in order to improve adhesiveness of the anti-reflection film or the photoresist film onto the top surface. If part of the vapor of the hydrophobic agent flows around to the back surface of the wafer during the hydrophobic process, the area exposed by the vapor on the back surface may become hydrophobic, which makes it difficult to make the exposed area be wet with the cleaning liquid. When the area is not wet with the fluid, the brush 5 directly touches the area of the back surface of the wafer W, which wears the brush 5 away when the brush 5 is rotated, thereby causing particles, which in turn contaminate the wafer W. In order to avoid such contamination, the top end of the brush 5 is preferably located in the vicinity of the back surface, leaving a gap G of, for example, 1 mm or less between the top end of the brush 5 and the back surface of the wafer W, as shown in FIG. 16. Even with the gap G, since rotation of the brush 5 can produce vigorous flow of the cleaning liquid, which is supplied from the cleaning liquid nozzle 5b (FIG. 2), the cleaning liquid can reach the back surface of the wafer W, thereby cleaning the back surface without producing any particles.

Figure 18:
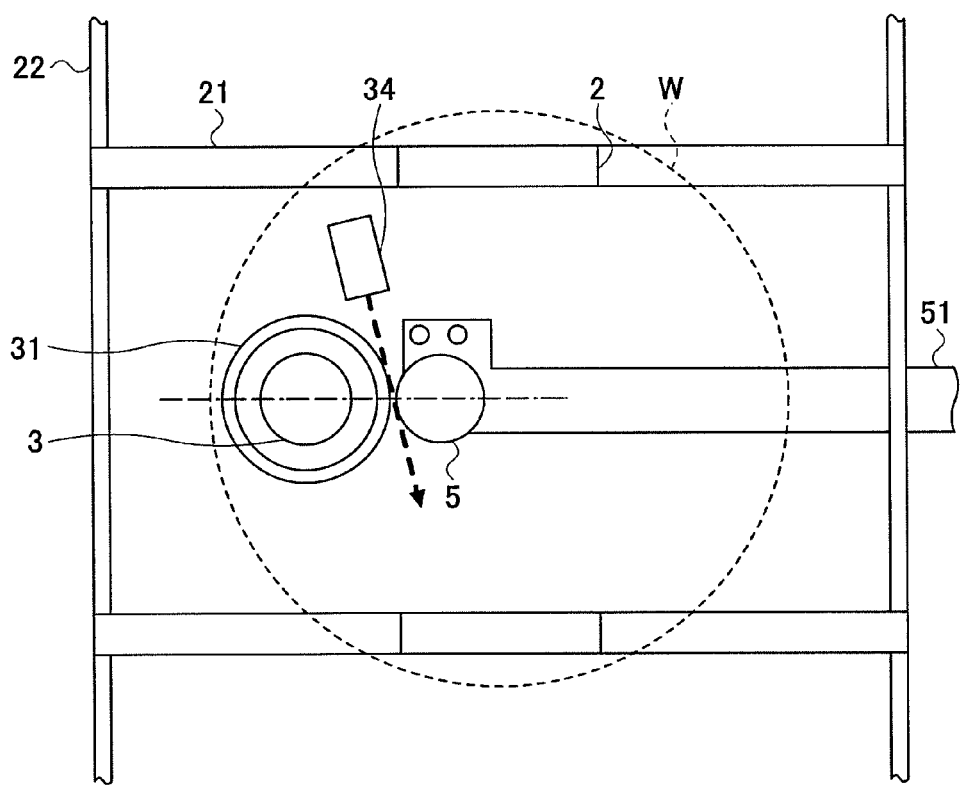
FIG. 18 is a schematic cross-sectional diagram of the substrate cleaning apparatus provided with an assist rinse mechanism.
Figure 19:
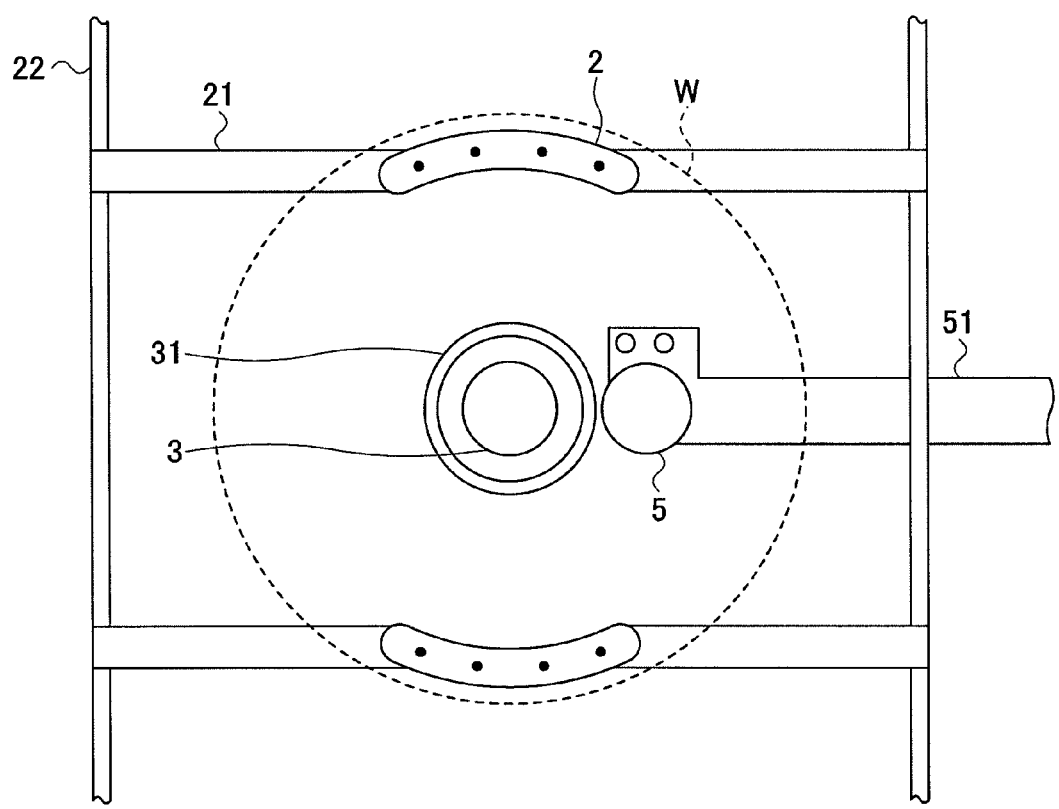
FIG. 19 is a plan view of another pair of wafer holding pads.

As another countermeasure, there may be provided an ultraviolet light source 17 in the under cup 43. When the back surface area exposed to the vapor of the hydrophobic agent, or a circumferential portion (a ring-shaped area having a width of about 25 mm from the wafer edge) on the back surface of the wafer W, is illuminated with the ultraviolet light from the ultraviolet light source 17, the hydrophobic agent is decomposed and the illuminated portion becomes hydrophilic. As shown in FIG. 18, such illumination can be performed, for example, by radiating a ray of the ultraviolet light having a width LW of, for example, about 25 mm from the wafer edge, while the wafer W is rotated by the spin chuck 3. The ultraviolet light source 17 may be realized by implementing a waterproofed ultraviolet lamp (UV lamp) in the under cup 43, or by providing a UV-transparent glass window on the bottom of the under cup 43 and locating the UV lamp below the window. In addition, the UV lamp may be located remotely from the cleaning apparatus 1 (100) and the UV light may be guided toward the back surface of the wafer W using an optical fiber. Moreover, the UV light from the UV lamp 12 in the lamp box 11 may be guided to the back surface of the wafer W supported by the spin chuck 3.

It should be noted that the UV light may be irradiated not on just the back surface area exposed with vapor of the hydrophobic agent but on the entire back surface.

Next, the cleaning apparatus 1 according to the first embodiment of the present invention may be provided with an exhausting apparatus 301 and an exhaust pipe 302 that can develop a reduced (or sub-atmospheric) pressure inside of the air knife 31, as shown in FIG. 3. In the inside space of the air knife 31, an upward air flow may be created by the gas ejected from the ejection orifices 31a so as to blow particles (if the particles are produced from the driving mechanism 33 of the spin chuck 3, the elevating mechanism 32a of the supporting pins 32, or the like) from the inside to the outside of the air knife 31 toward the wafer W. Such particles may contaminate the wafer W. However, the exhausting apparatus 301, such as a vacuum pump, and the exhaust pipe 302 that make the inside of the air knife 31 be in communication with the exhausting apparatus 301 can evacuate the inside space of the air knife 31, or develop a reduced pressure, even if only slightly, in the space, thereby preventing the upward flow that may lead to the wafer contamination. By the way, the exhaust pipe 302 can be connected to a vacuum line or the like of a semiconductor device fabrication plant (fab), which can serve as the exhausting apparatus 301.

In addition, the cleaning apparatus 1 may be provided with an assist rinse mechanism 34 that can eject the cleaning liquid such as deionized water so as to diffuse the flow of the cleaning liquid from the brush 5 toward the air knife 31. When the air knife 31 is used in the cleaning apparatus 1 in order to prevent the back surface area (the second area) that contacts the top surface of the spin chuck 3 and the top surface of the spin chuck 3 from being wet, a large amount of the air has to be ejected from the ejection orifices 31a of the air knife 31, which increases energy consumption and creates mist or droplets that in turn may contaminate the back and/or the top surface of the wafer W. However, the assist rinse mechanism 34, when implemented in the cleaning apparatus 1, can reduce the amount of the air from the air knife 31. Specifically, the assist rinse mechanism 34 is arranged so that the cleaning liquid (deionized water) from the mechanism 34 can pass through between the brush 5 and the air knife 31 on the back surface of the wafer W, as shown by a dashed arrow in FIG. 18. More specifically, the assist rinse mechanism 34 is preferably arranged so that the cleaning liquid is ejected to the back surface so as to cross a straight line connecting the center of the top surface of the spin chuck 3 and the center of the brush 5 when the brush 5 is located nearest to the air knife 31 (for example, in a location shown in FIG. 19). In this situation, it is preferable that an angle formed by a cross point at which the cleaning liquid direction (shown by the dashed arrow) intersects the straight line (a dashed-dot line), the center of the top surface of the spin chuck 3, and the center of the brush 5 be 90 degree or less. According to the assist rinse mechanism 34 so configured, the amount of the air for blowing away the cleaning liquid supplied from the cleaning liquid nozzle 5a can be reduced, thereby reducing energy consumption and preventing the mist or droplets from being produced. By the way, the assist rinse mechanism 34 may be configured so as to blow, for example, air from a compressed air source (not shown), instead of the cleaning liquid (deionized water), so that the air can diffuse the flow of the cleaning liquid from the brush 5 toward the air knife 31.

Figure 20:
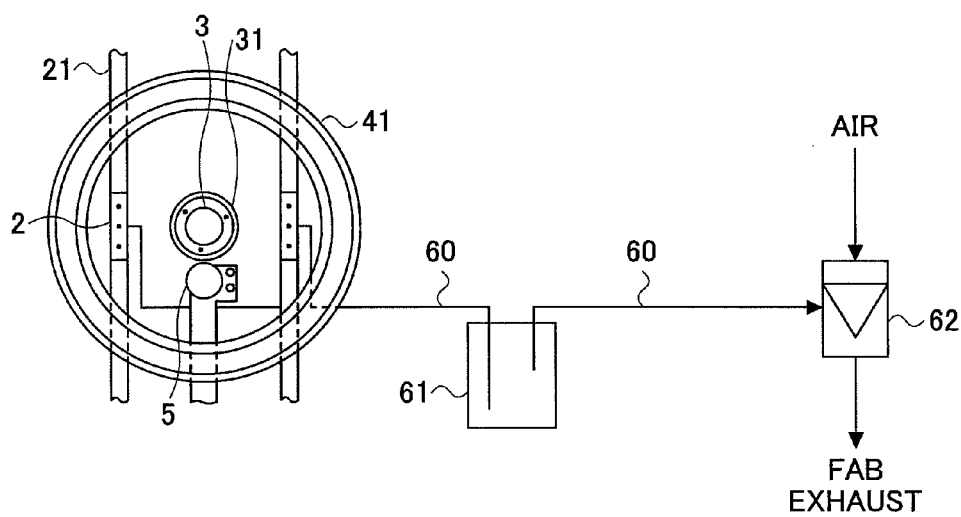
FIG. 20 is an explanatory diagram of a trap tank and/or an ejector in a middle of a suction tube connected to the wafer holding pad.

In the first embodiment of the present invention, the wafer holding pads 2 serving as the first substrate supporting portion have a top view shape of an elongated rectangle, as shown in FIG. 2, but may have different top view shapes. For example, the top view shape of the wafer holding pads 2 may be arc-shaped so that the top view shape is curved along a circle concentric with the wafer edge of the wafer held by the wafer holding pads 2, as shown in FIG. 20. The wafer holding pads 2 having such a top view shape allow a larger area of the back surface between the two wafer holding pads 2. Therefore, such wafer holding pads 2 are advantageous in that the larger area can be cleaned when the wafer W is held by the wafer holding pads 2 and the brush 5 is less likely to be hindered by the wafer holding pads 2.

In addition, when the wafer W is placed on the spin chuck 3, the wafer holding pads 2 may be wetted with the cleaning liquid since the wafer holding pads 2 are lowered below the wafer W. If the cleaning liquid falls on the wafer holding pads 2, the cleaning liquid on the wafer holding pads 2 is pulled into the holes 3a (FIG. 2) and further to, for example, a vacuum line provided in a fabrication plant (fab), when the holes 3a are in communication with the vacuum line. If this happens, the vacuum line suffers from degraded performance, which may adversely affect other process apparatuses in the plant. In order to prevent such a disadvantage, the cleaning apparatus 1 (100) may be provided with a trap tank 61 in the middle of a suction tube 60, as shown in FIG. 20. With this configuration, the cleaning liquid suctioned into the suction tube 60 can be trapped by the trap tank 61, so that the cleaning liquid is prevented from being pulled further through the suction tube 60. By the way, it is also preferable that the suction tube 60 be connected to an ejector 62 (FIG. 20) provided in the middle of an exhaust line of the fabrication plant. This may be advantageous in that the wafer W can be held on the wafer holding pads 2 by suction, without using the vacuum line of the plant.

Figure 21:
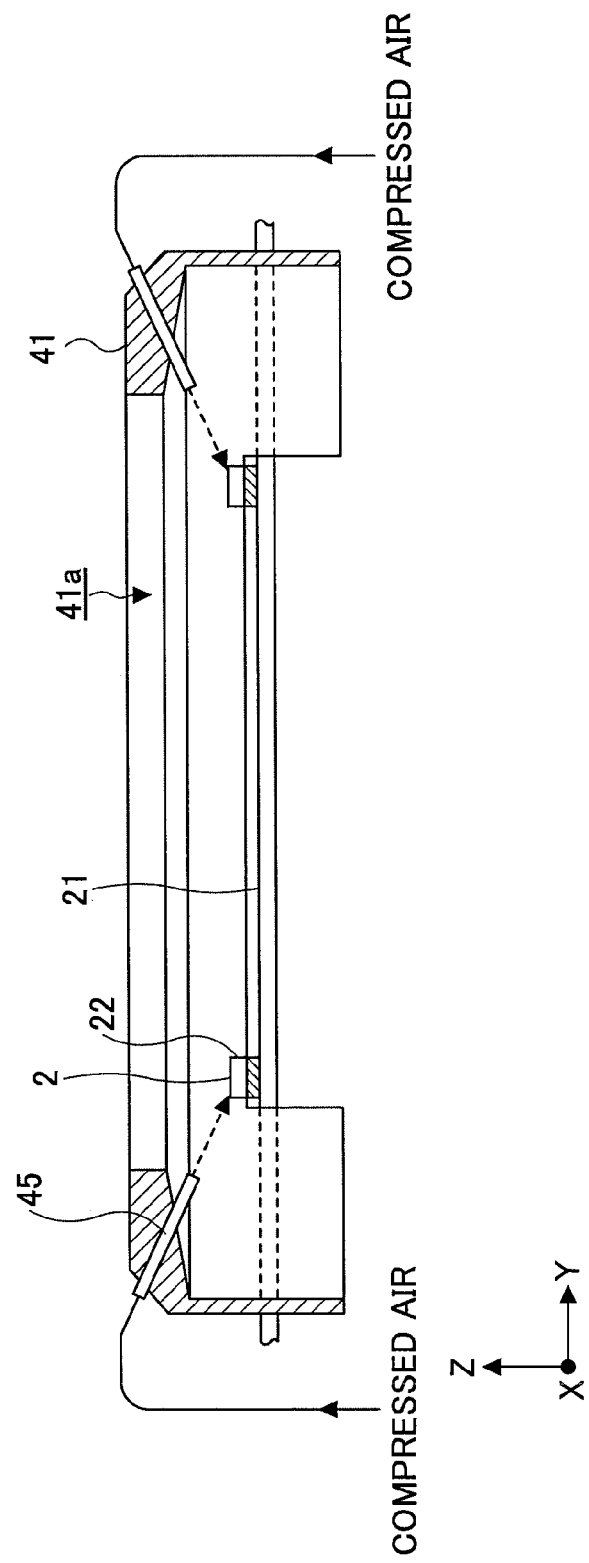
FIG. 21 is a schematic cut-away diagram of an upper cup provided with an air-curtain nozzle.
Figure 22:
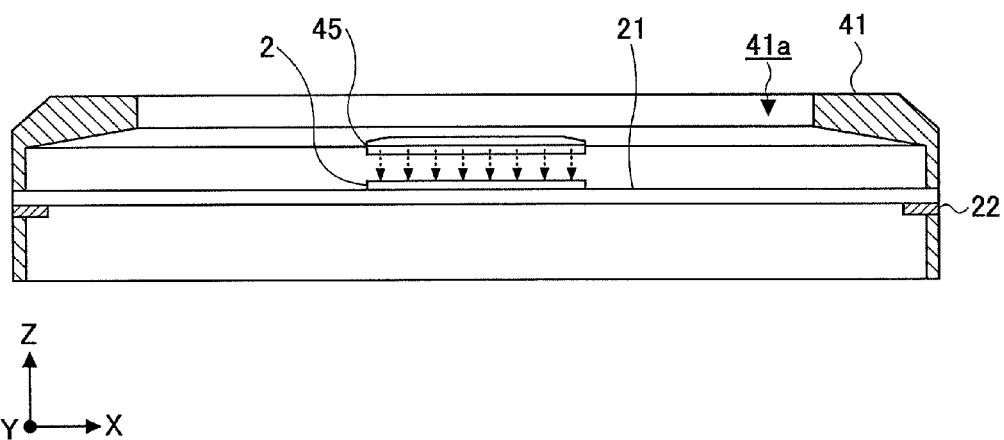
FIG. 22 is a schematic cut-away diagram of an upper cup provided with another air-curtain nozzle.

In addition, if the wafer W is held by the wafer holding pads 2 whose top surface is wetted with the cleaning liquid, the wafer W may be released from the wafer holding pads 2 when the back surface is being cleaned, because of reduced drawing strength of the wafer W. Moreover, the wafer holding pads 2 wetted with the cleaning liquid may contaminate the back surface of the wafer W since the cleaning liquid may contains particles or the like. In order to eliminate such disadvantages, air-curtain nozzles 45 may be provided so as to blow gas such as compressed air or the like so as to dry the top surface of the wafer holding pads 2, as shown in FIGS. 21 and 22. According to the air-curtain nozzles 45, the gas or the like can be blown onto the wafer holding pads 2 during which time the cleaned wafer is transferred out from the cleaning apparatus 1 (100) and the next wafer to be cleaned is transferred in.

Although the invention has been described in conjunction with the foregoing specific embodiments, the present invention is not limited to the embodiments specifically disclosed herein, but various alterations and modifications may be applied without departing from the scope of the invention set forth in accompanying claims.

The present application contains subject matter related to Japanese patent applications No. 2006-34309 and No. 2007-303453, filed with the Japanese Patent Office on Dec. 20, 2006 and Nov. 22, 2007, respectively, the entire contents of which are incorporated herein by reference.

What is claimed is:

1. A substrate cleaning method for cleaning a back surface of a substrate, the substrate cleaning method comprising steps of:
    a first substrate supporting step of supporting the substrate horizontally on a first substrate supporting portion, while the substrate is surrounded by a cup, by suctioning a first area of a back surface of the substrate, the back surface facing down;
    a second substrate supporting step of switching a supporting area from the first area to a second area that does not overlap with the first area and horizontally supporting the substrate on a second substrate supporting portion, while the substrate is surrounded by the cup, by suctioning the back surface of the substrate;
    a step of supplying a cleaning liquid to the back surface of the substrate supported in the first substrate supporting step or the second substrate supporting step;
    a step of drying the second area before supporting the substrate in the first substrate supporting step or in the second substrate supporting step;
    a first cleaning step of cleaning the back surface of the substrate including the second area during the first substrate supporting step; and
    a second cleaning step of cleaning the back surface of the substrate excluding the second area during the second substrate supporting step,
    wherein the first cleaning step further comprises, while supporting the substrate on the first supporting portion, vertically moving the first substrate supporting portion so as to place the back surface of the substrate in contact with a cleaning member, and horizontally moving the first substrate supporting portion so as to clean the back surface of the substrate with the cleaning member, the cleaning member being attached to a cleaning member supporting portion that extends in a horizontal direction, and the horizontal movement of the first substrate supporting portion being in a lateral direction parallel with the extending direction of the cleaning member supporting portion, and
    wherein the first cleaning step further comprises moving the cup vertically and horizontally to correspond with vertical and horizontal movements of the substrate.

2. The substrate cleaning method according to claim 1, further comprising:
    a step of spinning the substrate to throw off cleaning liquid remaining on the back surface of the substrate.

3. The substrate cleaning method according to claim 2, wherein the step of drying the second area is performed by blowing air onto the back surface of the substrate.

4. The substrate cleaning method according to claim 1, wherein the step of drying the second area is performed by blowing air onto the back surface of the substrate.

5. The substrate cleaning method according to claim 1, further comprising:
    a step of illuminating the back surface of the substrate with ultraviolet light to shrink particles remaining on the back surface of the substrate.

6. The substrate cleaning method according to claim 1, wherein the cup is moved vertically with vertical movement of the substrate such that the cup is made to surround the substrate during vertical movement of the substrate.

7. The substrate cleaning method according to claim 1, wherein the cup is moved horizontally with horizontal movement of the substrate such that the cup is made to surround the substrate during horizontal movement of the substrate.

8. The substrate cleaning method according to claim 1, wherein the cup is moved vertically and horizontally concurrently with vertical and horizontal movements of the first substrate supporting portion.

9. The substrate cleaning method according to claim 1, wherein the vertical and horizontal movements of the first substrate supporting portion and the cup are controlled by a common driving mechanism.

10. A substrate cleaning method for cleaning a back surface of a substrate, comprising:

carrying a substrate into an opening provided in an upper surface of a cup body of a cleaning apparatus, the cleaning apparatus comprising:

a spin chuck configured to support the substrate at a center of the back surface of the substrate, and to rotate the substrate, while the substrate is surrounded by the cup body, substrate supporting portions provided at opposite sides of the spin chuck and configured to support the substrate at vicinities of the periphery of the back surface of the substrate, while the substrate is surrounded by the cup body, and a cleaning member for cleaning the back surface of the substrate by contacting the back surface of the substrate, the cleaning member being attached to a cleaning member supporting portion that extends in a horizontal direction, wherein the cup body encloses the substrate in a manner to capture cleaning liquid that is spun off from the substrate;

supporting the substrate by the substrate supporting portions with surfaces of the substrate supporting portions that support the substrate at a first position higher than an upper surface of the cleaning member while the spin chuck is at a second position lower than the upper surface of the cleaning member;

while supporting the substrate on the substrate supporting portions, vertically lowering the substrate supporting portions to a second position where the cleaning member contacts the back surface of the substrate and supplying a cleaning liquid to the back surface of the substrate while horizontally moving the substrate supporting portions in a lateral direction parallel with the extending direction of the cleaning member supporting portion to thereby clean an area of the back surface of the substrate that is not supported by the substrate supporting portions;

transferring the substrate from the substrate supporting portions to the spin chuck; and moving the cup body vertically and horizontally to correspond with vertical and horizontal movements of the substrate.

11. The substrate cleaning method of claim 10, wherein transferring the substrate from the substrate supporting portions to the spin chuck is performed after a center of the back surface of the substrate is cleaned, and the performance of the transfer comprises:

raising the spin chuck to contact the center of the back surface of the substrate, and lowering the substrate supporting portions to retract them from the vicinities of the periphery of the back surface of the substrate, such that the spin chuck supports the substrate at the center of the back surface of the substrate; and the cleaning method further comprising, while supporting the substrate by the spin chuck, cleaning an area of the back surface of the substrate that is not supported by the spin chuck by rotating the substrate by the spin chuck.

12. The substrate cleaning method according to claim 10, wherein the cup body is moved vertically with vertical movement of the substrate such that the cup body is made to surround the substrate during vertical movement of the substrate.

13. The substrate cleaning method according to claim 10, wherein the cup body is moved horizontally with horizontal movement of the substrate such that the cup body is made to surround the substrate during horizontal movement of the substrate.

14. The substrate cleaning method according to claim 10, wherein the cup body is moved vertically and horizontally concurrently with vertical and horizontal movements of the substrate supporting portions.

15. The substrate cleaning method according to claim 10, wherein the vertical and horizontal movements of the substrate supporting portions and the cup body are controlled by a common driving mechanism.

* * * * *